(12) United States Patent
Wicker

(10) Patent No.: US 7,423,897 B2
(45) Date of Patent: Sep. 9, 2008

(54) METHOD OF OPERATING A PROGRAMMABLE RESISTANCE MEMORY ARRAY

(75) Inventor: Guy C. Wicker, Southfield, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 60 days.

(21) Appl. No.: 10/956,555

(22) Filed: Oct. 1, 2004

(65) Prior Publication Data

US 2006/0072357 A1    Apr. 6, 2006

(51) Int. Cl.
*G11C 11/00*   (2006.01)
(52) U.S. Cl. ............... 365/148; 365/100; 365/46
(58) Field of Classification Search ........... 365/148
See application file for complete search history.

(56) References Cited

U.S. PATENT DOCUMENTS

| | | | | |
|---|---|---|---|---|
| 5,818,749 A | * | 10/1998 | Harshfield | 365/105 |
| 6,569,745 B2 | * | 5/2003 | Hsu | 438/385 |
| 6,590,807 B2 | * | 7/2003 | Lowrey | 365/175 |
| 6,707,712 B2 | * | 3/2004 | Lowery | 365/175 |
| 6,754,107 B2 | * | 6/2004 | Khouri et al. | 365/185.23 |
| 6,831,856 B2 | * | 12/2004 | Pashmakov | 365/163 |
| 6,859,390 B2 | * | 2/2005 | Pashmakov | 365/163 |
| 6,965,521 B2 | * | 11/2005 | Li et al. | 365/148 |
| 6,967,865 B2 | * | 11/2005 | Lee | 365/163 |
| 7,020,006 B2 | * | 3/2006 | Chevallier et al. | 365/148 |
| 7,042,760 B2 | * | 5/2006 | Hwang et al. | 365/163 |
| 7,050,328 B2 | * | 5/2006 | Khouri et al. | 365/163 |
| 7,116,593 B2 | * | 10/2006 | Hanzawa et al. | 365/203 |

FOREIGN PATENT DOCUMENTS

JP        2004047027 A    *   2/2004

\* cited by examiner

*Primary Examiner*—Viet Q Nguyen
(74) *Attorney, Agent, or Firm*—Kevin L. Bray

(57) ABSTRACT

A method of operating a programmable resistance memory array. The method comprises writing to all of the programmable resistance elements within the same row of the memory array at substantially the same time. The programmable resistance elements preferably include phase-change materials such as chalcogenides.

19 Claims, 17 Drawing Sheets

US 7,423,897 B2

METHOD OF OPERATING A PROGRAMMABLE RESISTANCE MEMORY ARRAY

FIELD OF THE INVENTION

The present invention relates generally to electrically programmable memory arrays. More specifically, the present invention relates to circuitry and methods for writing data to and reading data from an array of programmable resistance elements.

BACKGROUND OF THE INVENTION

Programmable resistance memory elements formed from materials that can be programmed to exhibit at least a high or low stable ohmic state are known in the art. Such programmable resistance elements may be programmed to a high resistance state to store, for example, a logic ONE data bit or programmed to a low resistance state to store a logic ZERO data bit.

The use of electrically programmable phase-change materials (for example, materials which can be electrically programmed between amorphous and crystalline states) for electronic memory applications is well known in the art and is disclosed, for example, in commonly assigned U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Still another example of a phase-change memory element is provided in commonly assigned U.S. patent application Ser. No. 09/276,273, the disclosure of which is incorporated by reference herein.

Generally, phase-change materials are capable of being electrically programmed between a first structural state having a where the material is generally amorphous and a second structural state where the material is generally crystalline. The term "amorphous", as used herein, refers to a condition which is relatively structurally less ordered or more disordered than a single crystal. The term "crystalline", as used herein, refers to a condition which is relatively structurally more ordered than amorphous. The phase-change material exhibits different electrical characteristics depending upon its state. For instance, in its crystalline, more ordered state the material exhibits a lower electrical resistivity than in its amorphous, less ordered state.

Materials that may be used as a phase-change material include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy is the alloy $Ge_2Sb_2Te_5$.

FIG. 1 is a plot of the resistance of a chalcogenide phase-change memory element versus the amplitude of a current pulse through the memory element. Referring to FIG. 1, several different programming regimes can be distinguished. In the left side of the curve, the resistance of the device remains substantially constant (i.e., in its high resistance or RESET state) until a current pulse of sufficient energy is applied. The device is then transformed from its high resistance (RESET) state to its low resistance (SET) state. The current pulse sufficient to program the memory element from the high resistance state to the low resistance state is referred to as a "set pulse". While not wishing to be bound by theory, it is believed that the set pulse is sufficient to change at least a portion of the volume of memory material from a less-ordered amorphous state to a more-ordered crystalline state.

The memory device may be programmed back from the low resistance state or SET state to the high resistance or RESET state by applying a current pulse of sufficient amplitude and energy, referred to as a "reset pulse". While not wishing to be bound by theory, it is believed that application of a reset pulse to the memory element is sufficient to change at least a portion of the volume of memory material from a more-ordered crystalline state to a less-ordered amorphous state. The memory device may be programmed back and forth between the high resistance or RESET state and the low resistance or SET state. This type of programming scheme provides for a binary mode of operation (for example, the RESET state may be a logic 0 while the SET state may be a logic 1).

Referring to the right side of the curve of FIG. 1, as the amplitude of the current through the memory element increases, the resistance of the device increases. This increase is both gradual and reversible. In this regime, the phase-change memory element may be programmed to any resistance value within a window of resistance values bounded by the low resistance or SET state and the high resistance or RESET state. More specifically, in this regime along the right side of the curve, the phase-change memory element may be reversibly programmed from any one of the resistance states on the right side of the resistance curve to any other of the resistance states on the right side of the curve by the application of a current pulse of sufficient amplitude. The device may thus be programmed between three or more resistance values within the resistance window so as to provide for multi-state, directly overwritable data storage. With at least three resistance states, each of the memory elements is capable of storing more than one bit of information. While not wishing to be bound by theory, it is believed that each of the resistance states along the right side of the curve may correspond to a particular ratio of the volume of crystalline material to the volume of amorphous material in an active region of the phase-change material. As a particular example, four intermediate resistance states R1, R2, R3 and R4 are shown in the resistance curve of FIG. 1. In this multistate type of operation, each of the memory elements is capable of storing two bits of information.

SUMMARY OF THE INVENTION

A method of operating a memory system, the memory system including at least a first programmable resistance element and a second programmable resistance element, the method comprising: providing the programmable resistance elements, each of the elements programmable between at least two resistance states; programming the first programmable resistance element to one of the resistance states; programming the second programmable resistance element to one of the resistance states, the first programmable resistance element and the second programmable resistance element each being programmed to its corresponding resistance states at substantially the same time.

A method of operating an array of programmable resistance elements, the method comprising: providing the array of programmable resistance elements, the array including a plurality of the programmable resistance elements arranged in one or more rows and a plurality of columns; and writing data to all of the programmable resistance elements that are in a common row of the array at substantially the same time.

A method of operating an programmable resistance memory system, the memory system a memory comprising one or more memory cells including a programmable resistance element, one or more reference cells including a programmable resistance element, and a comparison circuit adapted to compare at least one sense signal developed by at least one of the memory cells to at least one reference signal developed by at least one of the reference cells, the method comprising: writing to each of the memory cells and to each of the reference cells at substantially the same time.

DETAILED DESCRIPTION OF THE INVENTION

Figure 1:
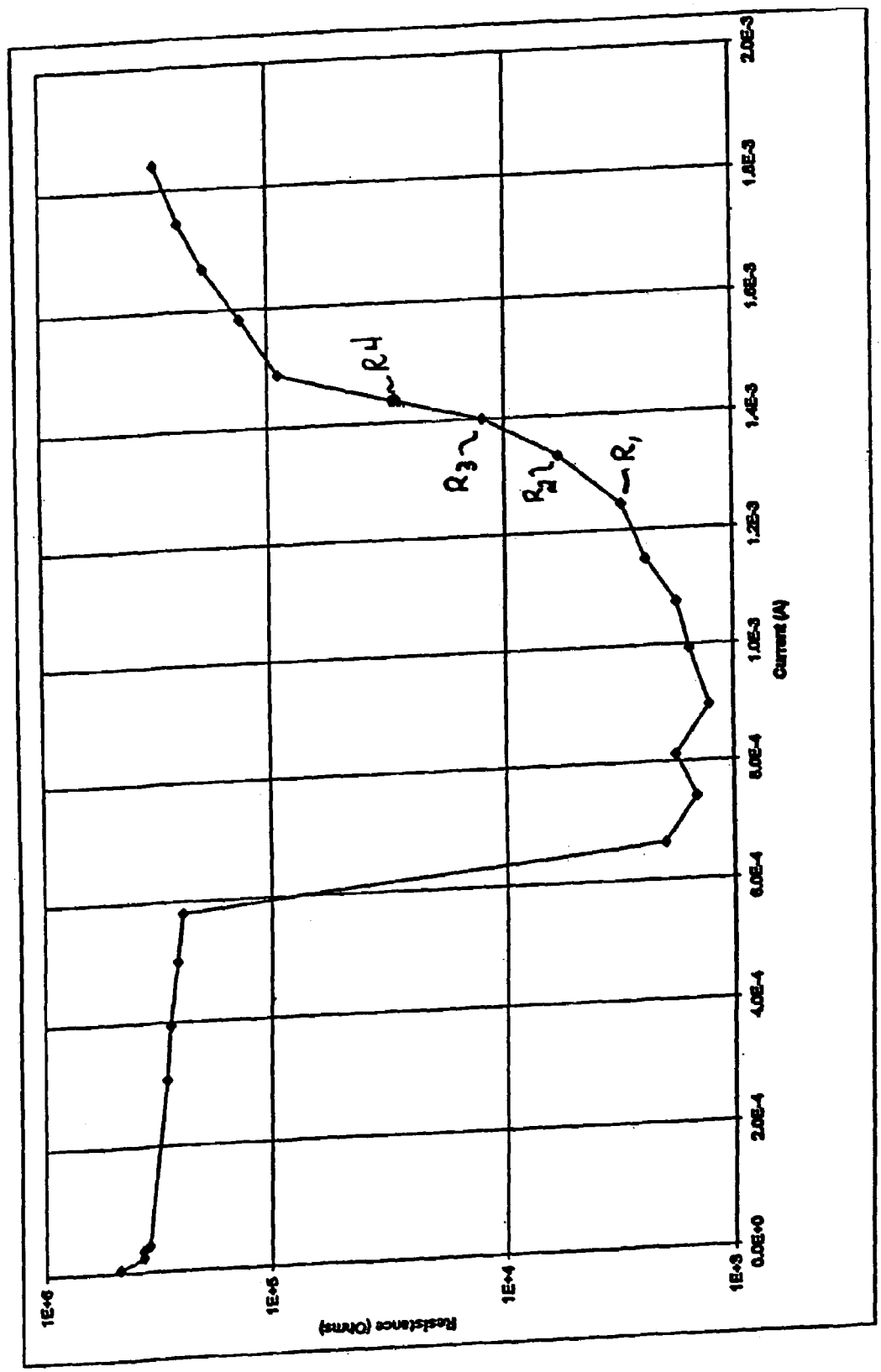
FIG. 1 is a example of a resistance curve of a chalcogenide-based phase-change memory element.

Disclosed herein is both circuitry and methods for reading from and writing to programmable resistance elements. Each of the programmable resistance elements is programmable to at least a first resistance state and a second resistance state. The programmable resistance elements may be programmable to at least three resistance states to provide for multibit operation. The programmable resistance elements are preferably arranged in one or more memory arrays.

As used herein, the terminology "resistance" refers to electrical resistance; the terminology "programmable resistance element" and "programmable resistance memory element" are synonymous and may be used interchangeably; "coupling" refers to "electrical coupling"; the terminology "at least one" is identical with "one or more" and these terms may be used interchangeably.

The first resistance state may correspond to a low resistance or SET state and the second resistance state may correspond to a high resistance or RESET state. The high resistance state has an electrical resistance value which is greater than the electrical resistance value of the low resistance state. The memory elements may be programmed by selectively applying energy pulses (and preferably, electrical energy pulses) having the appropriate amplitudes, pulse widths, rise times and falls times.

The memory system of the present invention comprises one or more memory cells operable to provide memory storage. Preferably, the memory system comprises a plurality of memory cells. The memory system preferably further comprises one or more reference cells operable to develop at least one reference signal for determining the resistance states of the memory cells. Preferably, the memory system comprises a plurality of reference cells. Each of the memory cells and each of the reference cells includes a programmable resistance element. The programmable resistance element may be programmed back and forth between a low resistance or SET state and a high resistance or RESET state so as to operate in binary mode. Alternately, the programmable resistance element may be programmed between at least three resistance states so as to operate in multistate mode. As used herein, language describing the resistance state of a memory cell or a reference cell is referring to the resistance state of the corresponding programmable resistance element. (Hence, when it is stated that a memory cell or reference cell is programmed to the first or second resistance state, this means that the corresponding programmable resistance element is programmed to the first or second resistance state).

Each of the memory cells and each of the reference cells may further include an isolation element used to electrically isolate each programmable resistance element from all other programmable resistance elements so that a specific memory element may be written to or read from without affecting any other memory element. Examples of isolation elements include diodes, bipolar transistors, as well as field effect transistors such as MOS field effect transistors. The isolation element may also be a threshold switch such as a threshold switch that uses a chalcogenide switching material (e.g. an Ovonic Threshold Switch or OTS). The MOS field effect transistors may use PMOS, NMOS, or CMOS technology. Preferably, the MOS transistors are switching devices which have a control terminal (i.e., the gate) which controls the current flow within the switch. Other types of switching devices may be used.

The memory system of the present invention preferably includes a comparison circuit. Generally, the comparison circuit is in electrical communication with the memory cells and the reference cells. Furthermore, the comparison circuit is adapted to compare at least one sense signal developed by at least one of the memory cells with at least one reference signal developed by at least one of the reference cells. The comparison circuit is further adapted to provide at least one output signal in response to the comparisons. The comparison circuit may be further adapted to latch the sense signals and the reference signals.

Each of the sense signals may be developed by directing at least one current (referred to herein as a "sense current") through at least one of the memory cells). Furthermore, each of the reference signals may be developed by directing at least one current (referred to herein as a reference current) through at least one of the reference cells. Each of the sense signals may be a voltage (referred to herein as a "sense voltage"). Furthermore, each of the reference signals may a voltage (referred to herein as a "reference voltage").

In one embodiment of the present invention, each of the sense signals is developed by a single memory cell. Preferably, the sense signal is developed by a particular memory cell by directing a sense current through the memory cell. The comparison circuit is adapted to compare this sense signal to a reference signal developed by at least one of the reference cells. Each of the reference signals may be developed by a single reference cell. Alternately, each of the reference signals may be formed by combining a plurality of signals from a plurality of reference cells. Preferably, the sense signal and the reference signal are both voltages. The comparison circuit compares the sense signal with the reference signal. As a result of this comparison, the comparison circuit provides an output signal which is preferably indicative of the resistance state of the memory cell (i.e., the resistance state of the corresponding programmable resistance element). Hence, the resistance state of the memory cell can be read.

The comparison circuit may be adapted to compare a sense signal developed by a memory cell to a single reference signal. Alternately, the comparison circuit may be adapted to compare a sense signal developed by a memory cell to a plurality of reference signals. The comparison circuit may be specially adapted to make this multiple comparison. For example, the comparison circuit may use signal processing, pattern recognition, artificial intelligence, and rule-based techniques to compare multiple reference signals to a sense signal to determine the resistance state of a memory cell. In the embodiment described above, the sense signal is developed by a single memory cell. In yet another embodiment of the invention, it is also possible that the sense signal is developed by a plurality of memory cells.

It is noted that the comparison circuit may be adapted so that a plurality of memory cells can be read at the same time. The plurality of memory cells may, for example, all be arranged in the same row of a memory array. Hence, a plurality of sense signals may be compared to a single reference signal which is developed by one or more of the reference cells. Alternately, a plurality of sense signals may be compared to a plurality of corresponding reference signals.

Hence, the comparison circuit of the present invention may be adapted to compare at least one sense signal developed by at least one of the memory cells to at least one reference signal developed by at least one of the reference cells.

The comparison circuit used on the memory system of the present invention may comprise one or more comparators. Preferably, each comparator has a first and a second input, and is adapted to compare a first input signal (preferably a voltage) received on the first input with a second input signal (preferably a voltage) and to provide an output signal based upon this comparison. An example of a comparator is a sense amplifier. One of the inputs of the sense amplifier may receive the sense signal while the other input may receive the reference signal. The comparison circuit may also be adapted to "latch" or store the sense signals and reference signals. As discussed above, it is conceivable that a comparison circuit may be developed which uses principles of signal processing, artificial intelligence, rule-based systems, pattern recognition, etc. to make the necessary comparisons.

Figure 2A:
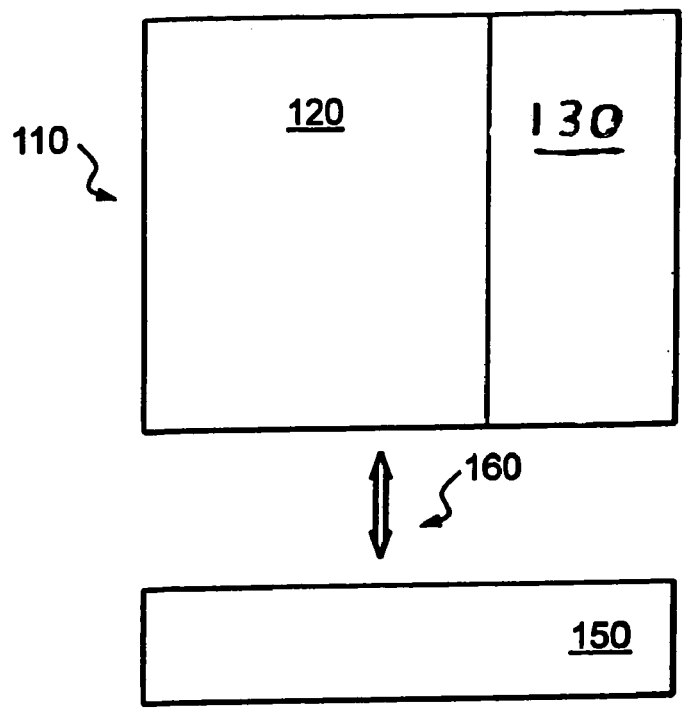
FIG. 2A is a block diagram of an example showing how a comparison circuit may be electrically coupled to a memory array having memory cells and reference cells.

The memory cells and the reference cells may be arranged in one or more memory arrays. In one embodiment of the present invention, the memory cells and the reference cells are arranged in the rows and columns of a single memory array. FIG. 2A shows a block diagram of a possible arrangement of memory cells and reference cells in a memory array 110. Preferably, the memory cells 120 are arranged in at least one column of the memory array 110. More preferably, the memory cells 120 are arranged as a plurality of columns of the memory array 110.

There is at least one column of reference cells 130. The memory cells 120 and reference cells 130 are in electrical communication with a comparison circuit 150. The electrical communication is represented by the double arrow 160 in FIG. 2A.

Figure 2B:
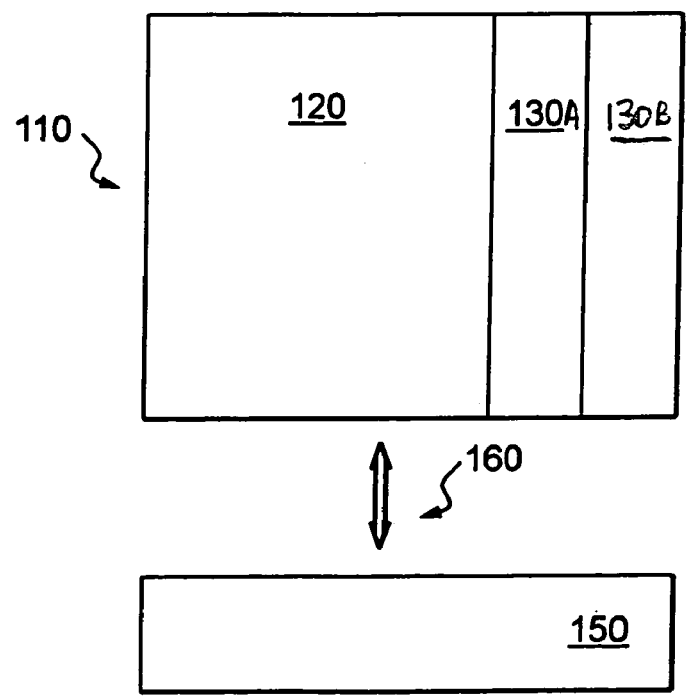
FIG. 2B is a block diagram of an example showing how a comparison circuit may be electrically coupled to a memory array having memory cells and reference cells.

FIG. 2B shows a block diagram of two columns of reference cells. Referring to FIG. 2B, the reference cells 130 include a column of "first" reference cells 130A and a column of "second" reference cells 130B. The first reference cells 130A are programmed to a first resistance state and the second reference cells are programmed to a second resistance state different from the first resistance state. The first resistance state may be the low resistance or SET state while the second resistance state may be the high resistance or RESET state. This type of scheme is particularly useful when the memory cells are operated in binary mode so that each of the memory cells will be programmed back and forth between its SET state and RESET state.

Figure 2C:
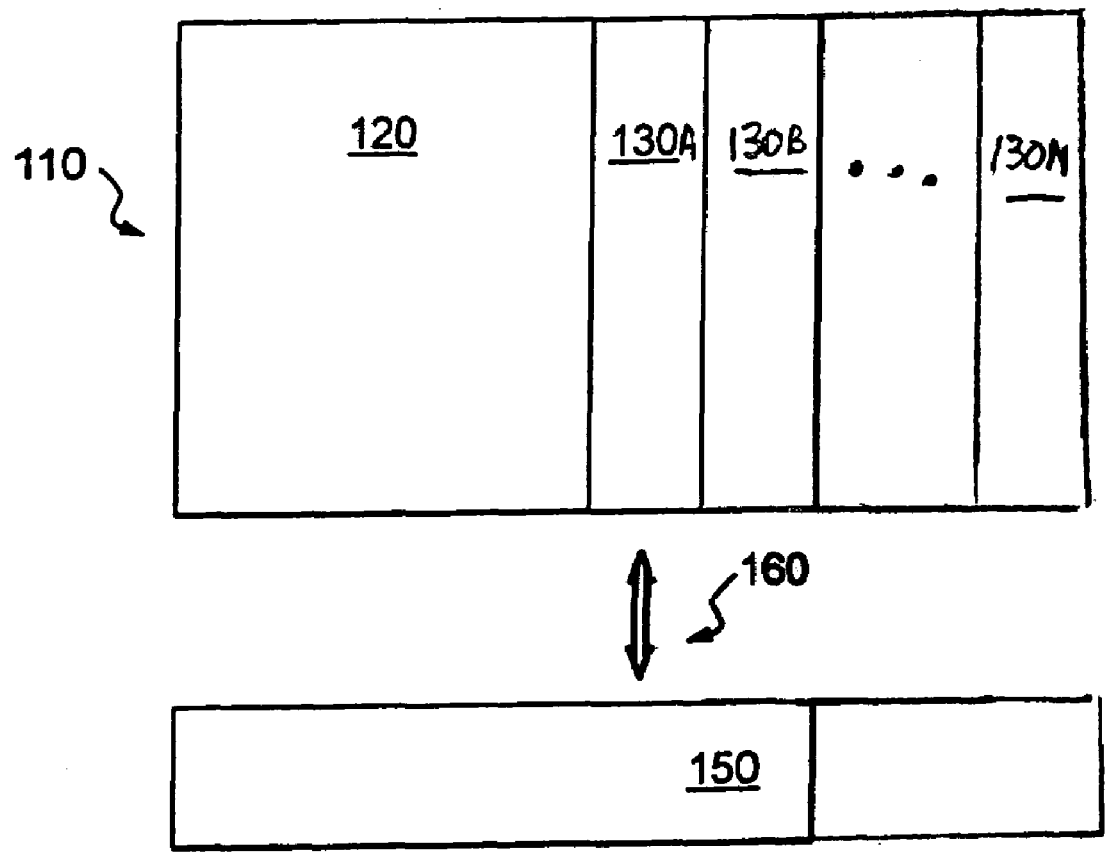
FIG. 2C is a block diagram of an example shown show a comparison circuit may be electrically coupled to a memory array having memory cells and reference cells.

FIG. 2C shows a block diagram of more than two columns of reference cells. Preferably, the reference cells in each column are programmed to the same resistance state, however, the reference cells in one column are programmed to a different resistance state from the reference cells in another column. The resistance states of the reference cells may be the same or different from the resistance states of the memory cells. For example, each of the columns of reference cells may programmed to one of the resistance states of the memory cells. As another example, each of the columns of reference cells may be programmed to values distinct from the resistance states of the memory cells (such as to values between consecutive resistance states of the memory cells).

Figure 3A:
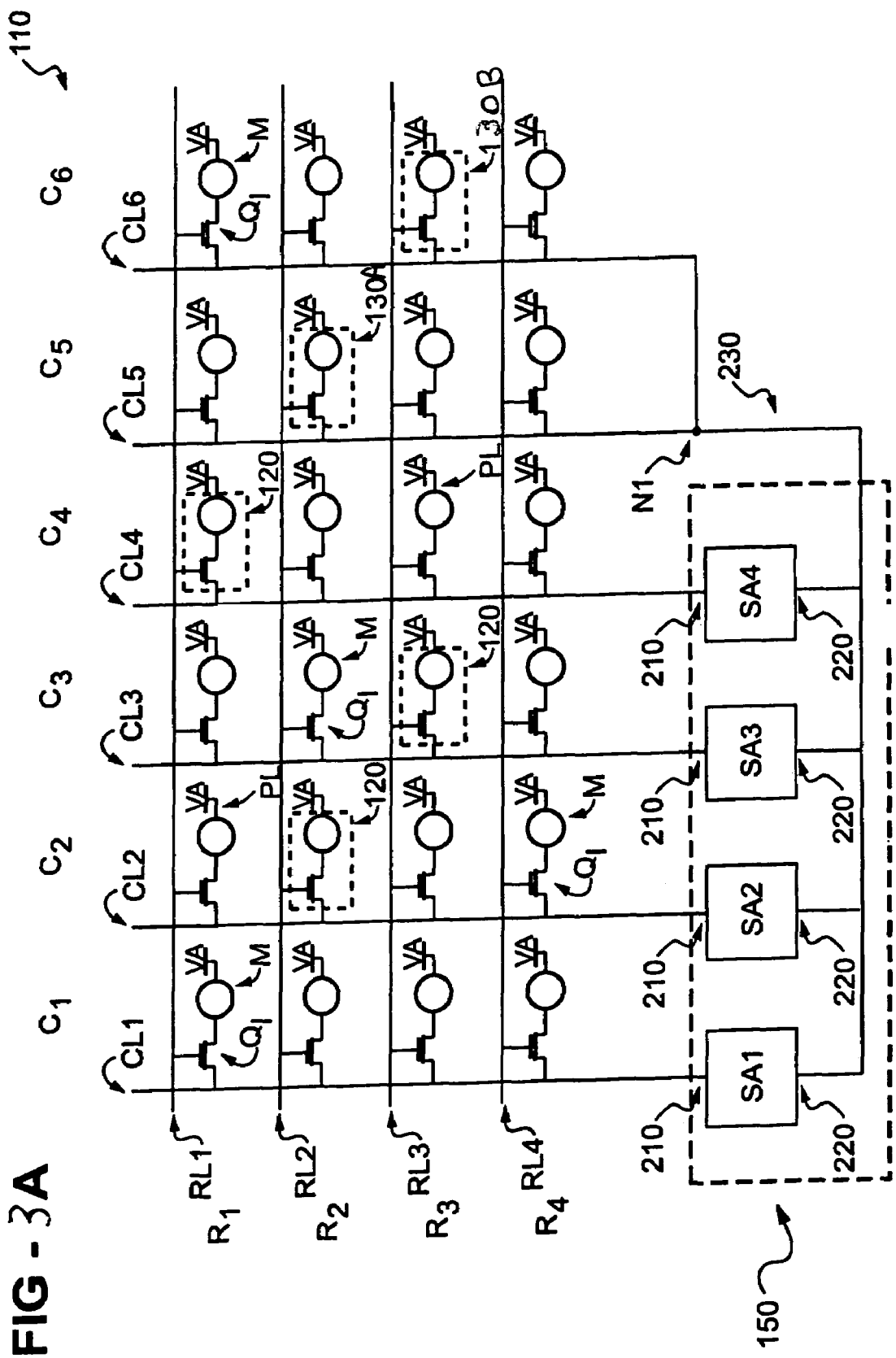
FIG. 3A is an embodiment of a memory array having memory cells and reference cells coupled to a comparison circuit.

FIG. 3A is a detailed example of the memory system of FIG. 2B. FIG. 3A shows a memory array 110 having columns C1 . . . C6 and rows R1 . . . R4. The memory cells 120 are arranged in the four columns C1 . . . C4 and in the four rows R1 . . . R4. The first reference cells 130A are arranged in column C5 and rows R1 . . . R4 of array 110. The second reference cells 130B are arranged in column C6 and rows R1 . . . R4 of array 110. In the example shown, there is a first reference cell and a second reference cell in each row of the memory array. It is noted that the size of the memory array (i.e., the number of rows and columns) is not limited to any particular number of rows or any particular number of columns. Preferably, there are at least two memory cells in each of the rows of the memory array. Also, the arrangement of the memory cells, first reference cells and second reference cells in the memory array is not limited to any specific columns in the memory array. It is noted that in other embodiments, the memory cells and reference cells may be arranged as rows so that there is one or more unique reference cell per column of the array.

Preferably, the memory array 110 further comprises a plurality of "row lines" and a plurality of "column lines". As used herein, the terminology "row line" is synonymous with the terminology "wordline". Each row line is associated with a corresponding row of the array. In the example of FIG. 3A, each row line RL1 . . . RL4 is associated with a corresponding row R1 . . . R4. Furthermore, each row line RL1 . . . RL4 is coupled to the memory cells and/or reference cells which are in the corresponding row.

The memory array 110 further comprises a plurality of "column lines". As used herein the terminology "column line" is synonymous with the terminology "bitline". Each of the column lines is associated with a corresponding column of the memory array. In the example of FIG. 3A, each column line CL1 . . . CL6 is associated with a corresponding column C1 . . . C6 of the array. Furthermore, each column line CL1 . . . CL6 is coupled to the memory cells and/or reference cells which are in the corresponding column. In the example shown, column lines CL1 . . . CL4 are coupled to the memory cells in columns C1 . . . C4, respectively. Column lines CL5 and CL6 are coupled to reference cells in column C5 and C6, respectively.

In the example shown in FIG. 3A, each memory cell and each reference cell is coupled to a row line and to a column line. Furthermore, each memory cell and each reference cell is also coupled to a "power line" PL which is preferably distinct from either the row line or the column line. The power line couples the memory cell or reference cell to a power source which is preferably a voltage source VA. Preferably, VA is some fixed value. It is possible that VA could be zero (such as a ground). Also, other implementations are possible where the third power line PL is not used.

Figure 4A:
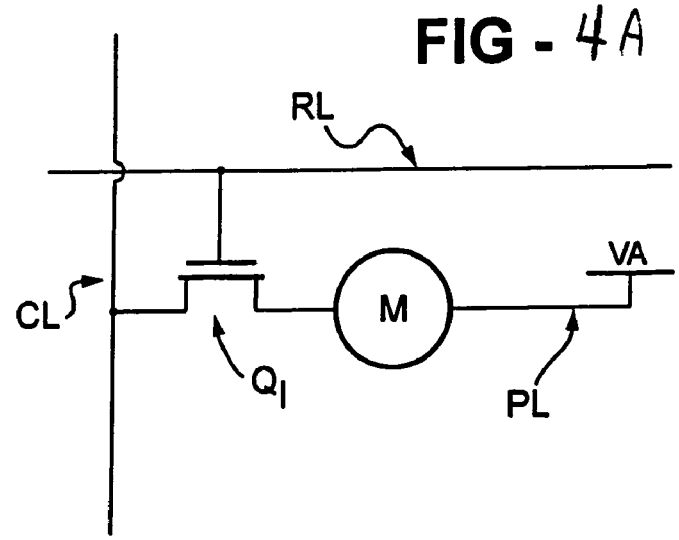
FIG. 4A is a schematic diagram showing a configuration of a memory cell or reference cell.

FIG. 4A shows a single memory cell (or reference cell) from FIG. 3A interconnecting a column line CL with a row line RL. As shown, the memory element M is directly coupled to the voltage source VA (through the power line PL) while the programmable resistance element M is selectively coupled to the column line CL through the current path of the isolation MOS transistor $Q_I$. More specifically, a first terminal of the transistor $Q_I$ (i.e., source or drain) may be coupled to the column line CL, a second terminal of the transistor $Q_I$ (source or drain) may be coupled to a first terminal of the memory element M, the control terminal of the transistor $Q_I$ (the gate) may be coupled to the row line RL, and a second terminal of the memory element M may coupled to the power line PL. The power line PL couples the memory element to the voltage source VA.

Figure 4B:
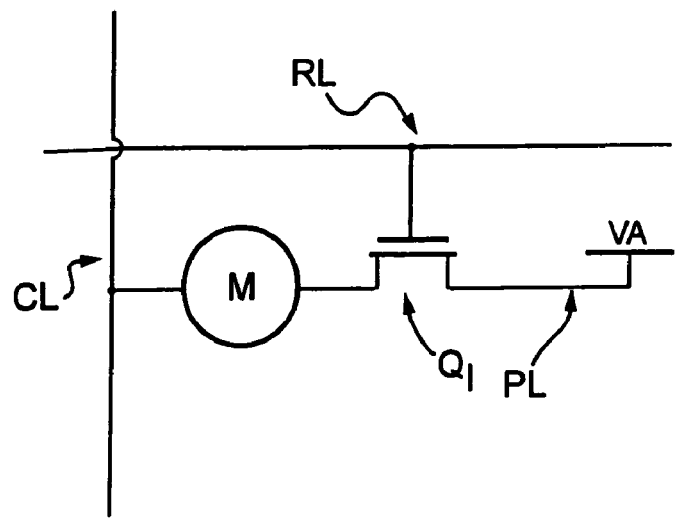
FIG. 4B is a schematic diagram showing a second configuration of a memory cell or reference cell.

A second embodiment of a memory cell configuration which uses a power line PL is shown in FIG. 4B. In this case, the memory element M is directly coupled to the column line CL while the power line PL (and the voltage source VA) is selectively coupled to the memory element through the current path of the isolation MOS transistor $Q_I$.

It is noted that it is conceivable that a configuration for the memory cell is possible where the programmable resistance elements are either coupled or selectively coupled to the row line rather than the column line.

As seen from either FIG. 4A or 4B, switching transistor $Q_I$ on couples the voltage source VA to the column line through the memory element M. If the voltage on the column line is different from VA, there will be a potential difference across the memory element and current will flow through the memory element.

Preferably, when the memory element M is being read, the potential difference across the memory element M is set to a first potential difference which is less than the threshold voltage of the device. This is done to prevent the device from changing states during the read operation. With the potential below the threshold voltage a current may then be directed through the memory element to develop a sense signal. However, when the memory element is being written to, it is preferable that the potential difference across the memory element be set to a second potential difference which is greater than the threshold voltage of the device. This ensures that the device is switched on. Currents may then be directed through the memory element sufficient to write data to the memory element. For example, currents may be directed through the device which are sufficient to either set or reset the memory element.

Hence, a memory cell may be operated by developing a first potential difference across the corresponding programmable resistance element during a read operation and a second potential difference across the programmable resistance element during a write operation. Preferably, the first potential difference is less than the threshold voltage of the programmable resistance element. Preferably, the second potential difference is greater than the threshold voltage of the programmable resistance element. The potential difference across the programmable resistance element may be varied by varying the value of VA applied to the memory element via the power line PL (i.e., the third line which is distinct from either the column line or the row line). For example, a first value of VA may be used during a read operation which is sufficient to cause the first potential difference described above. Likewise, a second value of VA may be used during a write operation which is sufficient to create the second potential difference described above. It is noted that both the reading and writing steps both include the step of directing a current through the memory element.

As noted above, the memory system of the present invention further comprises a comparison circuit. Referring again to FIG. 3A, the comparison circuit 150 may be implemented by one or more comparators such as one or more sense amplifiers. In the example shown in FIG. 3A, the comparison circuit comprises a plurality of sense amplifiers SA1 . . . SA4 where each of the sense amplifiers SA1 . . . SA4 is associated with a corresponding column of memory cells C1 . . . C4.

Each of the column lines CL1 . . . CL4 is coupled to a first input 210 of a corresponding sense amplifier SA1 . . . SA4. The column lines CL5 and CL6 (associated with columns C5 and C6 of reference cells) are directly coupled together at node N1. (In an alternate embodiment, the column lines CL5 and CL6 may be selectively coupled together through a switching means such as through the current path of a MOS transistor). The reference node N1 is coupled to a second input 220 of each of the sense amplifiers SA1 . . . SA4. This may be done through a reference line 230.

The resistance state of the memory cells may be determined by the sense amplifiers by comparing sense signals developed by the memory cells to reference signal developed by the reference cells. To determine the resistance state of a memory cell 120, a sense signal developed by the memory cell is compared to a reference signal developed by the first and second reference cells 130A, 130B which are in the same row as the memory cell. Preferably, the sense signal is a sense voltage developed by directing a current through the programmable resistance element of the memory cell. The sense voltage is related to the resistance of the programmable resistance element of the memory cell. Preferably, the reference signal is a reference voltage developed by directing currents through the programmable resistance elements of a first and a second reference cell, respectively. The reference voltage is related to the resistances of the programmable resistance elements of the first and second reference cells. The sense voltage appears on the column line corresponding to the memory cell being read and on the first input 210 of the corresponding sense amplifier (i.e., the sense amplifier coupled to this column line). The reference voltage appears on the column lines C5 and C6 which are coupled together at node N1. The reference voltage also appears on the reference node N1 as well as on the second input 220 of each of the sense amplifiers. It is noted that in the example shown, the reference voltage is a single voltage developed by both the first and second reference cells.

Figure 3B:
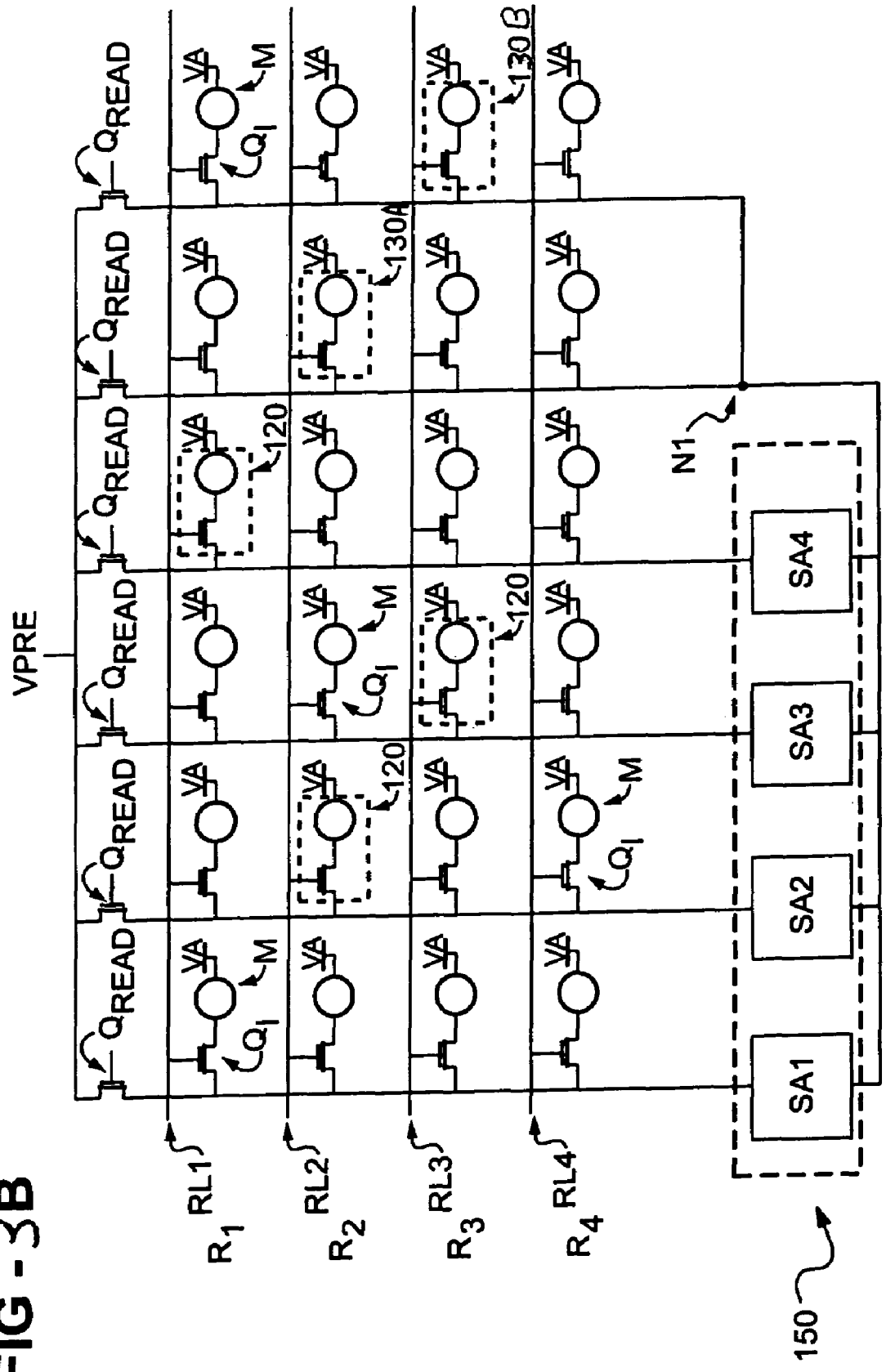
FIG. 3B is an embodiment of a memory array having memory cells and reference cells coupled to a comparison circuit with a precharge voltage coupled to the column lines.

Generally, a single memory cell may be read or, alternatively, more than one memory cell may be read at the same time. In the implementation shown in FIG. 3A, an entire row of memory cells may be read at the same time. For example, to read the memory cells of row R2, all of the column lines CL1 . . . CL6 may first be "precharged" to a voltage VPRE. (It is noted that other implementations are possible where the resistance states of the memory cells are read without first precharging the column lines). The column lines may be precharged by temporarily connecting the lines to a precharge voltage source VPRE through one or more switching devices such as through the current path of one or more MOS transistors. These MOS transistors may be kept on for a period of time sufficient to charge the column lines to the voltage VPRE. An example of using MOS transistors to precharge each of the column lines is shown in FIG. 3B. FIG. 3B shows a plurality of MOS transistors $Q_{READ}$ where each transistor selectively couples a corresponding column line to the precharge voltage VPRE.

To read the memory cells of row R2, the potential on the corresponding row line RL2 is then raised or lowered to a level sufficient to switch on each of the corresponding isolation MOS transistors $Q_I$ (i.e., the transistors $Q_I$ coupled to row line RL2).

When an isolation transistor $Q_I$ is switched on, the corresponding programmable resistive element M is coupled to its respective column line. Hence, by switching on the entire row R2 of isolation transistors $Q_I$, all of the corresponding programmable resistance elements M on the same row (both memory cells as well as reference cells) are coupled to their respective column lines CL1 . . . CL6. Each programmable resistance element M is also coupled to the power line voltage source VA. Since, there is a potential difference between the power line voltage VA and the voltage on the column line, current flows through the current path of the isolation transistor $Q_I$ and through the programmable resistance element M. This current causes the column lines CL1 . . . CL6 to charge from the precharge voltage VPRE toward the power line voltage VA. Preferably, when the memory element is being read, the precharge voltage VPRE and the power line voltage VA are chosen so that the potential difference across the memory element is less than its threshold voltage. As discussed above, this is done to prevent the memory element from changing resistance states as a result of the read operation.

The time needed to charge a column line is directly proportional to the capacitance of the column line as well as the resistance of the corresponding programmable resistance element M coupled to the column line. A column line with a larger capacitance will take longer to charge than a column line with a smaller capacitance. Also, a column line coupled to a memory element in a higher resistance state will take longer to charge that a column line coupled to a memory element in a lower resistance state. Hence, the sense signals and the reference signals are related to the resistance state of the programmable resistance elements of the memory cells and reference cells, respectively.

When a row R2 of the memory array is read, each sense amplifier SA1 . . . SA4 compares the sense voltage on a corresponding column line CL1 . . . CL4 to the reference voltage on reference node N1. The columns lines CL5 and CL6 are coupled at the reference node N1 to form a "coupled line" having a capacitance which is about twice the capacitance of an individual column line in the array. The reference voltage VREF on node N1 is related to the capacitance of this coupled line as well as to the resistances of both the first reference cell 130A and second reference cell 130B in row R2. Each sense amplifier SA1 . . . SA4 compares the sense voltage on a corresponding column line CL1 . . . CL4 (which is coupled to the first input 210 of the respective sense amplifier) to the reference voltage at node N1 (which is electrically coupled to the second input 220 of each sense amplifier). In response to these comparisons, the sense amplifiers provides output signals which are indicative of the resistance state of the memory cells 120 in row R2 of the memory array 110.

As noted, in the example shown in FIGS. 3A and 3B, an entire row of memory cells is preferably read at the same time. Alternately, other implementations are possible where only a single memory cell is selected to be read. For example, the read circuitry may use a column decoder circuit to select only one of the column lines. An example of a column decoder circuit for a memory array is provided in U.S. Pat. No. 5,883,827, the disclosure of which is incorporated herein by reference.

The example in FIGS. 3A and 3B shows only one column line CL5 of first reference cells 130A and one column line CL6 of second reference cells 130B. In other embodiments, there may be a plurality of column lines of first reference cells 130A and/or a plurality of column lines of second reference cells 130B coupled together at a reference node, such as reference node N1.

As noted, in the example provided above, the reference signal is a single reference single (preferably a reference voltage) developed by both a first and a second reference cell. The single reference signal is developed on a coupled column line (i.e., CL5 coupled to CL6 at a reference node N1). This single reference signal is developed by more than one memory element (preferably by at least one memory element programmed to the first resistance state and at least one memory element programmed to the second resistance state).

Figure 3C:
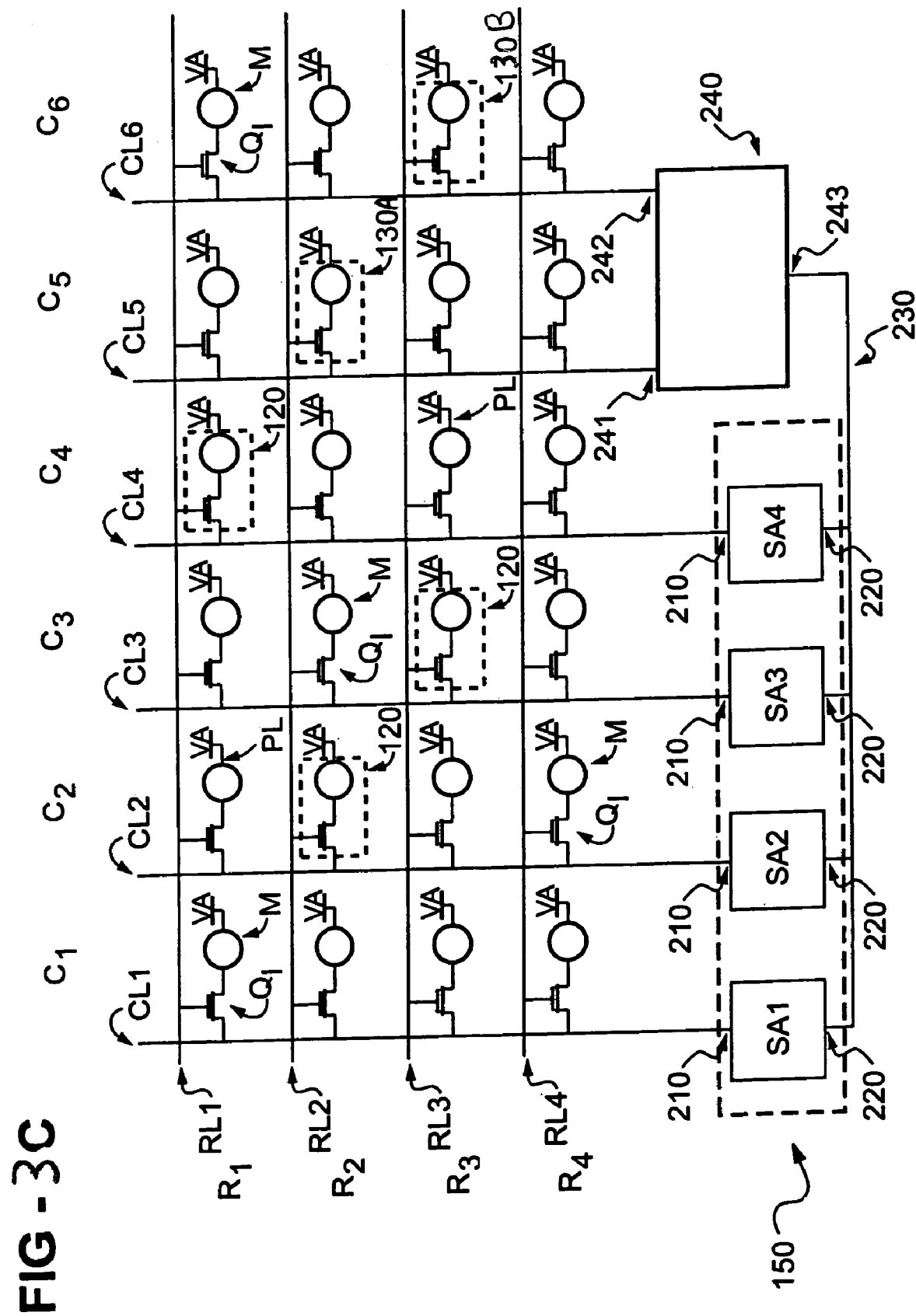
FIG. 3C is an embodiment of a memory array having memory cells and reference cells coupled to a comparison circuit showing how a signal processing circuit may be coupled to the column lines to form a reference signal.

A reference signal may also be developed by multiple memory elements in an alternative way. FIG. 3C shows a memory system which includes a signal processing circuit 240 having a first input 241 coupled to column line CL5, a second input 242 coupled column line CL6, and an output 243 coupled to the reference line RL.

In the example shown in FIG. 3C, a first signal is developed by a first reference cell 130A on CL5 and provided to first input 241, and a second signal is developed by a second reference cell 130B on CL6 and provided to second input 242. The signal processing circuit 240 uses the first and second reference signals to determine the resistance state of the memory elements. The signal processing circuit 240 preferably "combines" the first and second signals to form a reference signal on output 243 which is compared with the sense signal developed by the memory cell. This reference signal appears on the second input 220 of each sense amplifier SA1 . . . SA4.

"Combination" refers to any linear or nonlinear electrical, adding, subtracting, multiplying, dividing, mixing, convoluting, transforming, or the like, of the first and second signals. For example, the signals may be added together and/or multiplied together. The signals may be transformed to a different domain (for example, to the frequency domain). The "combination" may be a linear combination of the first and second reference signals, such as a weighted average or an arithmetic average. Alternately, the "combination" may be a nonlinear combination of the first and second signals. For example, the signals may be multiplied or divided. Also, the combination may be the geometric mean of the first and second signals. The signal processing circuit 240 may be analog, digital or a mixture of analog and digital. An example of an analog signal processing circuit is one which connects input 241, input 242, and output 243 to a common node.

Preferably, the first signal is a first voltage developed on CL5 by directing a current through a first reference cell 130A on CL5, and the second signal is a second voltage developed by directing a current through the second reference cell 130B on CL6. As described above, there may be more than one column of first reference cells and/or more than one column of second reference cells. Preferably, the reference signal is developed by one or more first signals developed by at least one first reference cell 130A and one or more second signals developed by at least one second reference cell 130B.

Figure 3D:
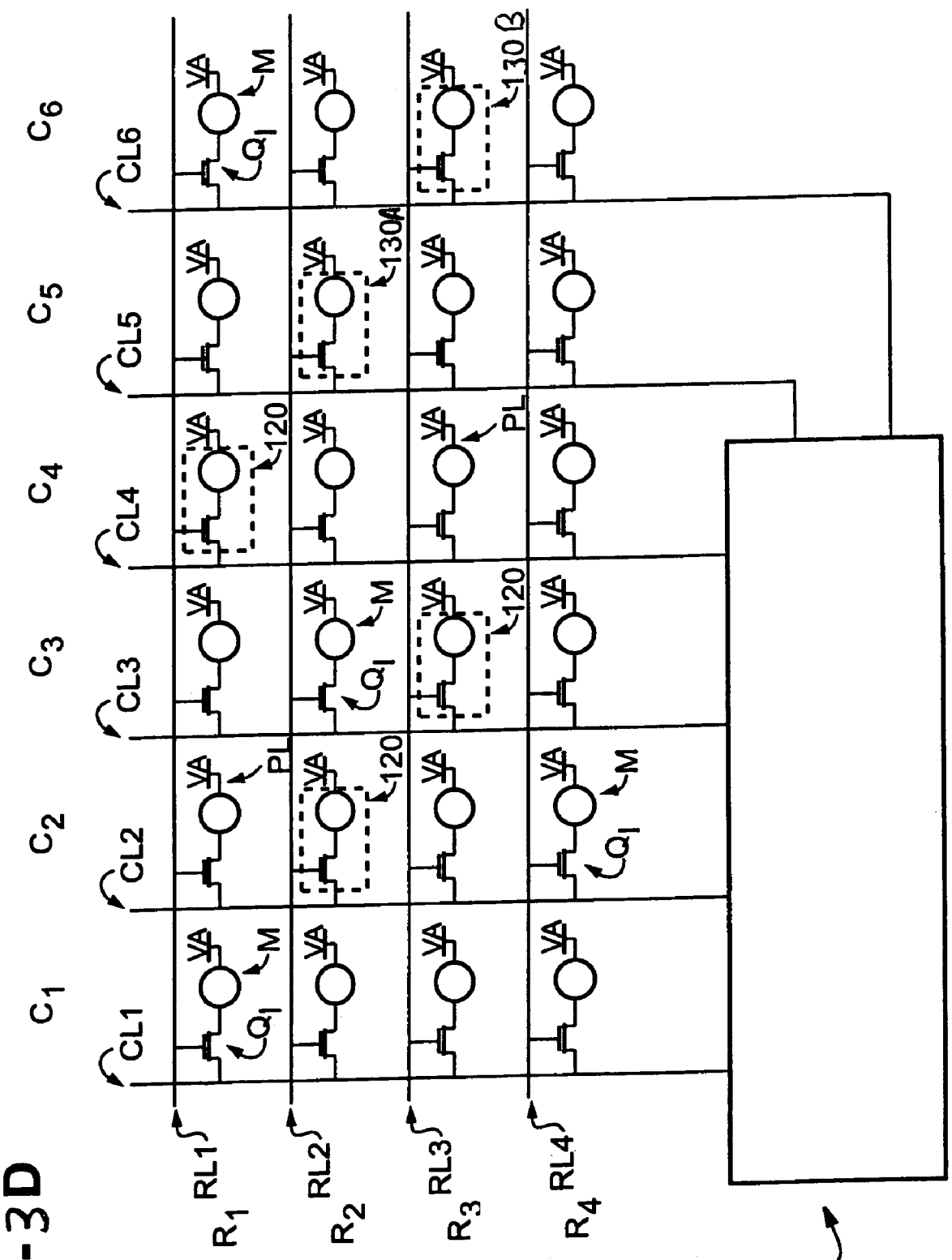
FIG. 3D is an embodiment of a memory array having memory cells and reference cells showing how a specially designed comparison circuit may be coupled to the column lines.

FIG. 3D shows yet another implementation of the first embodiment of the present invention. In this example, the column lines CL1 . . . CL4 as well as the column lines CL5 and CL6 are all directly coupled to a comparison circuit 250. The comparison circuit 250 uses the sense signals developed by the memory cells as well as the first and second reference signals developed by the first and second reference cells 130A, 130B, respectively, to determined the resistance states of the memory cells. In other words, the first and second reference signals may each be used individually (rather than combined into a single signal) to determine the resistance states of the memory cells. The comparison circuit 250 may compare a sense signal developed by a memory cell to both the first and second reference signals in order to determine the resistance state of the memory cell. Alternately, the 250 may be a digital processing circuit (such as a microprocessor based circuit), an analog processing circuit or a mixture of a digital and analog processing circuit. It also may have signal processing capabilities as well as comparison capabilities. It may use principles of artificial intelligence, such as a rule-based system, to determine the resistance state of the memory cell.

It is noted that the arrays shown in FIGS. 3A, 3B, 3C and 3D may be adapted and/or modified and/or expanded so that they may be used for either binary or multistate operation. For example, the system shown in FIG. 3D may be expanded by adding additional columns of reference cells.

It is noted that in the embodiments shown in FIGS. 3A, 3B, 3C and 3D, the columns of reference cells are to the end of the array. However, the reference cell columns may be any of the columns of the array, including columns that are at or near the center of the array.

It yet other implementations it is possible that only one of the reference cells (i.e., either the first or the second) be used to determine the resistance state of the memory cell.

There are yet additional implementations of the first embodiment of the present invention which are possible. Other arrangements are possible wherein the reference cells (either first reference cells, second reference cells, or a combination of first and second reference cells) are arranged in rows of the memory array or in both rows and columns of the memory array. Furthermore, the reference cells may not even be located on the same memory array as the memory cells. One way to accurately and robustly read the resistance states of a multistate memory element is to use one or more reference cells where the reference cells have the same type of programmable resistance elements as the memory cells. Generally, because the reference signals are developed from reference cells having the same type of programmable resistance elements as the memory cells, the variations and drift in the resistance values of the memory cells will be "tracked" (and compensated for) by corresponding variations and drift in the reference cells. This results in a highly robust and accurate system for reading the data stored in the memory cells. In addition, in order to improve the accuracy of determining the resistance states of the memory cells, it is possible to write to or program all of the memory cells and all of the reference cells that are located in a common row of the memory array at substantially the same time.

Figure 12:
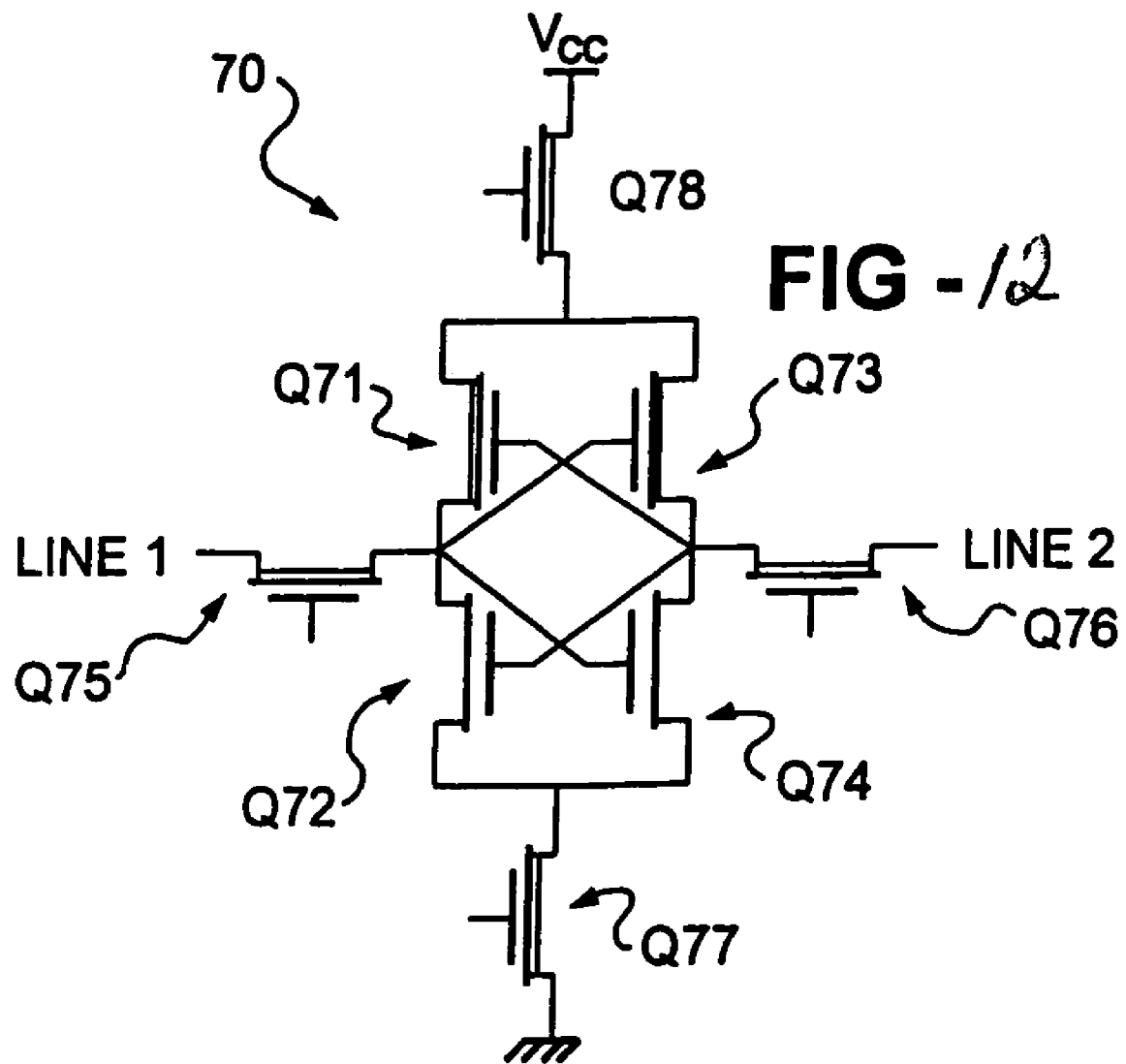
FIG. 12 is an embodiment of a sense amplifier.

An example of a sense amplifier 70 which may be used in the memory systems of the present invention such as shown in FIGS. 3A, 3B or 3C is shown in FIG. 12. Referring to FIG. 12, PMOS transistor Q71 and NMOS transistor Q72 form a first CMOS inverting amplifier. Likewise, PMOS transistor Q73 and NMOS transistor Q74 form a second CMOS inverting amplifier. The inverting amplifiers form a cross-coupled latch. The first and second CMOS inverting amplifiers are cross coupled so that when one turns on, it forces the other one to turn off. NMOS transistor Q75 is an isolation transistor which selectively couples a first input line LINE1 to the gates of transistor Q73 and Q74 of the second inverting amplifier. Likewise, NMOS transistor Q76 is an isolation transistor which selectively couples a second input line LINE2 to the gates of transistor Q71 and Q72 of the first inverting amplifier. When the isolation transistor Q75 is turned on, this couples the first input line LINE1 to the gates of Q73 and Q74. Since the capacitance of the gates is small compared to the capacitance on the first input line, the voltage on the gates is substantially equal to the voltage on the first input line. Likewise, when the isolation transistors Q76 is turned on, this couples the second input line LINE2 to gates of Q73 and Q74. The voltage on the gates of Q73 and Q74 is substantially equal to the voltage on the second input line. The NMOS transistor Q77 selectively couples the source of transistors Q72 and Q74 to ground. When transistor Q77 is turned on, this biases the source of transistors Q72 and Q74 so that both the first and second inverting amplifiers may begin to discharge. Assuming, for example, that the voltage on input line LINE1 is higher than the voltage on input line LINE2, then the gate voltage on the second inverting amplifier will be higher than the gate voltage on the first. The second inverting amplifier will conducts faster than the first and will discharge the gate of the first. However, substantial charge remains on the gate of the second amplifier.

The PMOS transistor Q78 selectively couples the source of transistors Q71 and Q73 to the voltage source VCC. When transistor Q78 is turned on, both of the inverting amplifiers turn on. The amplifier with the charge on the gate, i.e., the second inverting amplifier, will switch low, forcing the first amplifier to switch high. The states of the first and second amplifiers are now in a stable (i.e., latched) condition and can be read by other circuitry.

The sense amplifier shown in FIG. 12 may be used in the examples shown in FIGS. 3A, 3B or 3C. Specifically, first input line LINE1 of the sense amplifier may be coupled to one of the column lines C1 . . . C4 from the memory array shown in FIG. 3A. The second input line LINE2 may be coupled to the reference node N1 shown in FIGS. 3A, 3B, or to the line 230 shown in FIG. 3C.

When a memory cell is read, it is desirable that the read operation does not change the state of the memory element. For example, when the memory element is read while it is in the high resistance state, it is preferable that the electrical energy applied to the memory element does not program the memory element to its low resistance state. A memory element may be programmed from its high resistance state to its low resistance state when the voltage across the memory element goes above its threshold voltage. Hence, when the memory element is read, the voltage across the memory element device is preferably kept below its threshold voltage.

When a memory element is read, the voltage across the memory element may be kept below its threshold value by appropriately selecting the value of the precharge voltage VPRE. For example, the value of the precharge voltage VPRE may be selected so that the voltage drop across the memory element is less than the device threshold voltage. The precharge voltage VPRE may be a ground voltage.

Referring to the embodiments of the memory cell shown in FIGS. 4A and 4B, during a read operation, the voltage values across the memory element may also be kept below its threshold value by appropriately selecting a power line voltage VA which is sufficient to limit the voltage across the memory element so that it is below the device threshold value. Hence, the power line voltage may be a variable voltage having at least two voltage values—a first voltage value VA1 used when the memory element is read (i.e., reading data from the memory cell), and a second voltage value VA2 used when the memory element is programmed to either the first or second resistance states (i.e., when data is written to the memory cell). Hence, an embodiment of a method of operating the memory system of the present invention comprises a reading step where the power line voltage source VA is programmed to a first voltage VA1, and a writing step where the power line voltage VA is programmed to a second voltage VA2. Preferably, VA2 is greater than VA1.

In one example, to read the device, the power line voltage source VA may be brought to some level near Vcc/2 (that is, VA1 is about Vcc/2). The column lines may be precharged to a value which is about 0.5 volts below VA. The row line is set to a voltage sufficient to turn on the isolation element (for example, the transistor $Q_I$ as shown in FIG. 4A) and allow current to flow through the memory element M. The current flowing through the programmable resistance element charges the column line capacitance from the precharge voltage toward a final voltage of VA.

The voltage on the column line may be compared to a reference voltage where the reference voltage itself is developed by a reference cell including a programmable resistance element. The reference voltage may be developed by directing a current through the reference cell. After the comparing the voltages, the comparison circuit provides an output signal which corresponds to the resistance state of the programmable resistance element of the memory cell.

The programmable resistance element may be a multistate memory element. An example of a multistate memory element is a programmable resistance element which is programmable to at least three detectably distinct resistance states. That is, the programmable resistance element is programmable to at least a first resistance state, a second resistance state and a third resistance state. This provides for more than one bit of data per memory cell. For example, using four resistance states provides for two bits of data per memory cell. Likewise, using sixteen resistance states provides for four bits of data per memory cell.

One way to accurately and robustly read the resistance states of a multistate memory element is to use one or more reference cells where the reference cells have the same type of programmable resistance elements as the memory cells. Generally, because the reference signals are developed from reference cells having the same type of programmable resistance elements as the memory cells, the variations and drift in the resistance values of the memory cells will be "tracked" (and compensated for) by corresponding variations and drift in the reference cells. This results in a highly robust and accurate system for reading the data stored in the memory cells.

Figure 6:
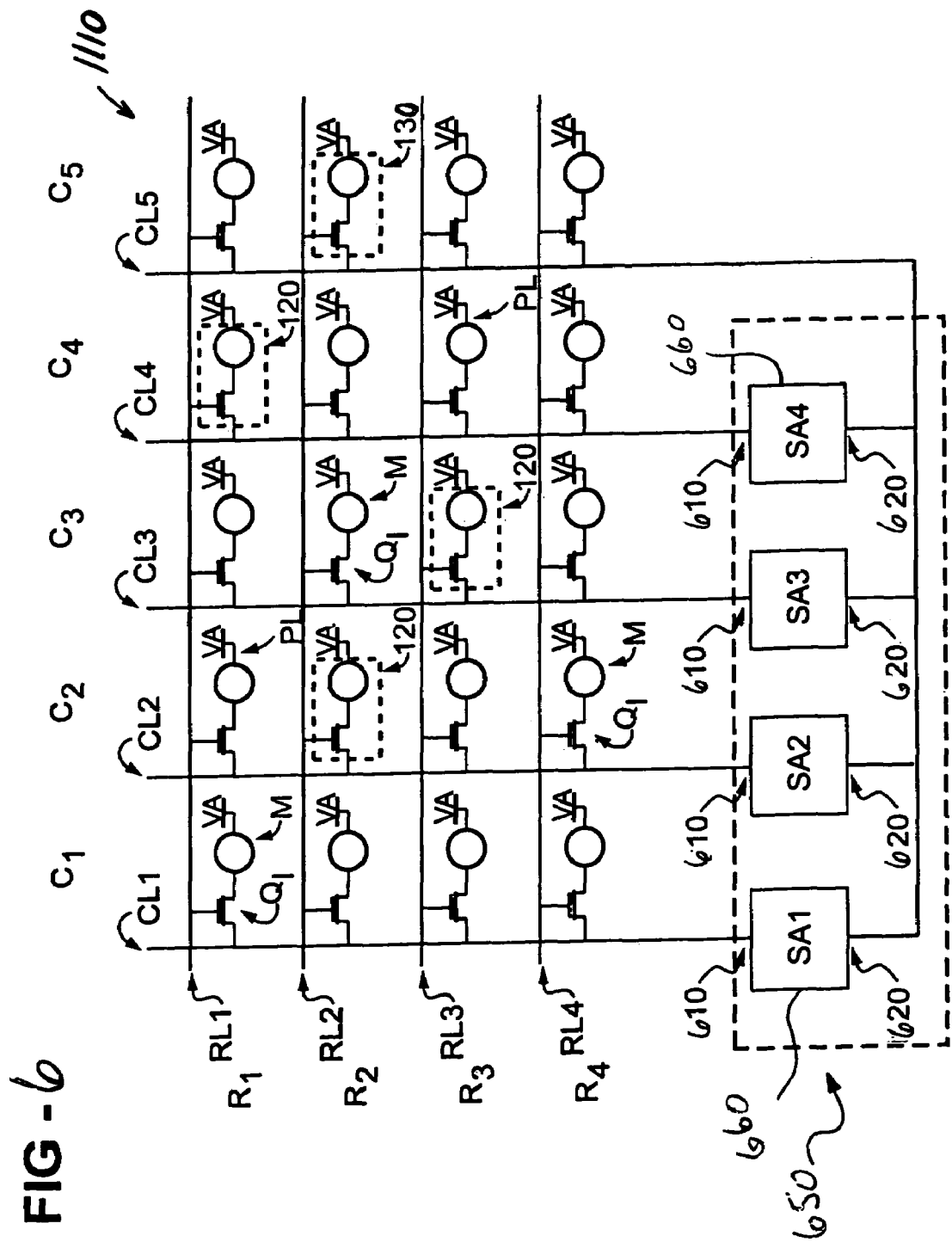
FIG. 6 is an embodiment of a memory array having memory cells and reference cells coupled to a comparison circuit.

An example of a memory system that makes use of reference cells to determine the state of multistate memory cells is shown in FIG. 6. FIG. 6 shows a memory array 1110 having columns C1 . . . C5 and rows R1 . . . R4. Associated with the columns are column lines CL1 . . . CL5 and associated with the rows are row lines R1 . . . RL4. The memory cells 120 are arranged in the four columns C1 . . . C4 and in the four rows R1 . . . R4 of the array 1110. Reference cells 130 are arranged in column C5 and rows R1 . . . R4. Each of the column lines CL1 . . . CL4 is coupled to a first input 610 of a corresponding sense amplifier 660 (SA1 . . . SA4 of the comparison circuit 650. The column line CL5 is coupled to a second input 620 of each of the sense amplifiers 660. The memory array preferably includes at least two memory cells for each row of the array. In addition, it is possible that the array consist of only a single row. Preferably, the array includes at least two rows.

Figure 7:
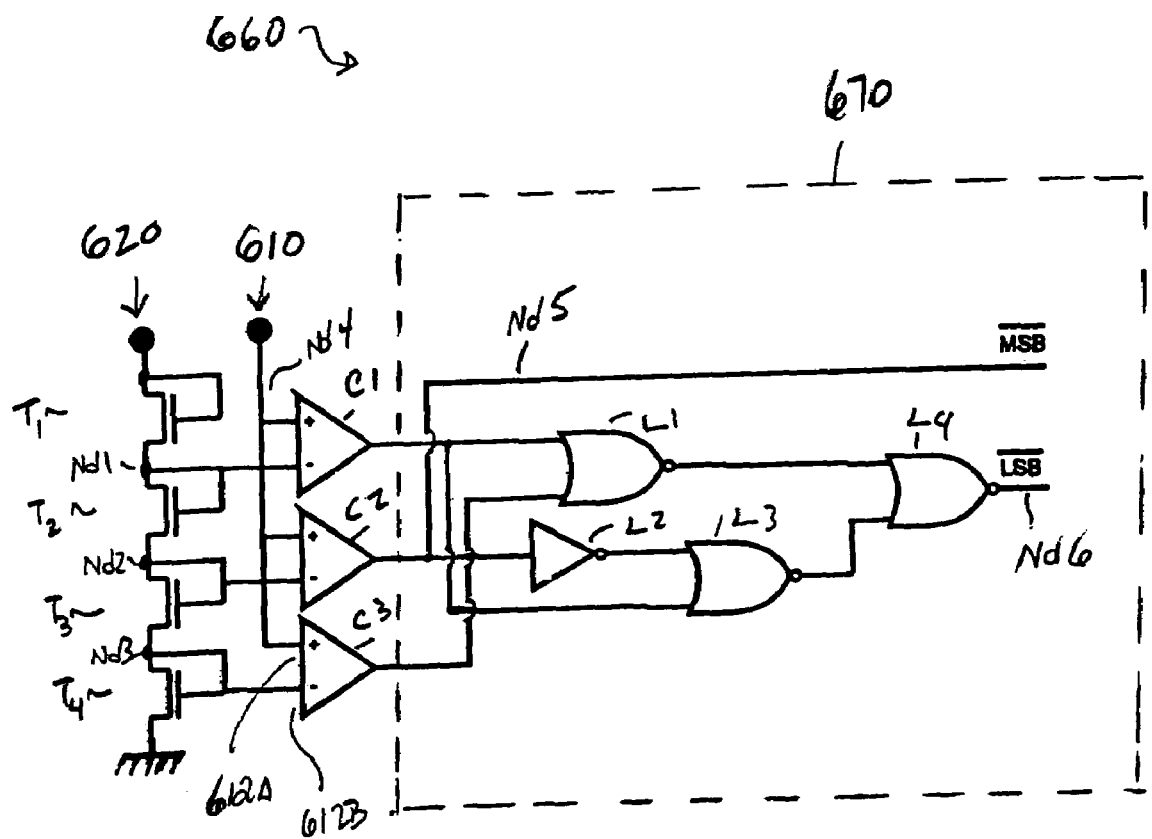
FIG. 7 is a diagram of an embodiment of a sense amplifier circuit.

An example of a sense amplifier 660 that may be used of any of the sense amplifiers SA1 . . . SA4 to distinguish the difference states is shown in FIG. 7. FIG. 7 shows a sense amplifier 660 having inputs 610 and 620. As shown in FIG. 6, input 610 is coupled to a corresponding column line CL1 . . . CL4 to provide a sense signal to the sense amplifier while input 620 is coupled to the column line CL5 to provide a reference signal to the sense amplifier. The sense amplifier 660 includes NMOS transistors T1 . . . T4 that are coupled in series between input 620 and ground. The gate of each of the transistors is coupled to the drain of the same transistor so that each of the transistors T1 . . . T4 is configured as an equally biased resistor. The circuit 660 further includes comparators C1, C2 and C3. Each comparator has a positive terminal 612A (marked "+") and a negative terminal 612B (marked "−"). The input 610 is coupled to the positive terminal 612A of each of the comparators C1, C2 and C3. The negative terminal 612B of comparator C1 is coupled to node Nd1. The negative terminal of comparator C2 is coupled to node Nd2. Likewise, the negative terminal of comparator C3 is coupled to node Nd3. The output of comparator C1 is coupled to a first input of NOR gate L1 as well as to a first input of NOR gate L3. The output of comparator C2 is coupled to node Nd5 as well as to the input of INVERTER L2. The output of inverter L2 is coupled to a first input of NOR gate L3. The output of comparator C3 is coupled to the second input of NOR gate L1 as well as the input of NOR gate L3. The output of NOR gate L1 coupled to a first input of NOR gate L4. The output of NOR gate L3 is coupled to a second input of NOR gate L4. The output of NOR gate L4 is coupled to node Nd6. Collectively, the logic gates L1, L2, L3 and L4 form a 4 to 2 encoder 670. The node Nd5 is the inverse of the most significant bit MSB. The node Nd6 is the inverse of the least significant bit LSB.

Each of the comparators C1, C2, C3 compares the voltage at the positive terminal 612A to the voltage at the negative terminal 612B. The voltage at the positive terminal 612A is determined by the voltage at input 610, which is the voltage on the corresponding column line CL1 . . . CL4. The voltage on the column line CL1 . . . CL4 is related to the resistance of the memory cell 120 coupled to the column line. For example, if row R1 is being read, then the voltage at each of the inputs 610 is related to the resistance values of each of the memory cells in row R1.

The voltage on the negative terminal 612B of each of the comparators C1, C2, C3 is determined by the voltage at nodes Nd1, Nd2, Nd3 respectively. The voltages at nodes Nd1, Nd2, Nd3 are determined by the voltage at input 620, which is the voltage on the corresponding column line CL5. The voltage on the column line CL5 is related to the resistance of the reference cell 130 coupled to the column line CL5 and to the particular row line being read. For example, if row R1 is being read, then the voltage at input 620 is related to the resistance value of the reference cell 130 in row R1 and column C5. Preferably, each of the reference cells 130 in column C5 are programmed to the same resistance value.

For purposes of illustration, it is assumed that the each of the multistate memory cells 120 of the array 1110 is programmable to four resistance states R1, R2, R3 and R4 (with R4>R3>R2>R1). Each of the resistance states R1, R2, R3 and R4 results in a corresponding voltage V1, V2, V3 and V4 at the input 620 (with V1>V2>V3>V4). The voltages at the nodes Nd1, Nd2 and Nd3 are determined by the voltage at input 620 as well as the characteristics of the transistors T1, T2, T3 and T4. As noted above, the voltage at input 620 is related to the resistance of the reference cell 130. The resistance of the reference cell 130 is preferably selected so that the voltages at nodes Nd1, Nd2 and Nd3 fall between the values V1, V2, V3 and V4. That is, the voltage at node Nd1 is preferably between V1 and V2, voltage at node Nd2 is preferably between V2 and V3, and the voltage at node Nd3 is preferably between V3 and V4. The voltages at the node Nd1, Nd2 and Nd3 may thus be used by the comparators C1, C2 and C3 to determine whether the voltage at node 620 is V4, V3, V2, or V1 (thereby determining if the resistance state corresponds to R4, R3, R2 or R1, respectively). Preferably, the reference cells 130 are programmed to a resistance state of R1 so that the voltage at input 620 is V1.

The value of the voltage at nodes Nd5 and Nd6 are determined by the voltages at the inputs 610 and 620. The values of Nd5 and Nd6 represent the inverse of the most significant bit "MSB" and the least significant bit "LSB" of the resistance state. The values of the voltages at the inputs 610, 620, the outputs of C1, C2, C3, the voltages at nodes Nd5 and Nd6, the values of MSB and LSB, as well as the corresponding resistance state are listed in the following TABLE. A high voltage is represented by "1" while a low voltage is represented by a "0".

TABLE

| Input 610 | Input 620 | C1 | C2 | C3 | Nd5 | Nd6 | MSB | LSB | Resistance |
|---|---|---|---|---|---|---|---|---|---|
| V1 | V1 | 1 | 1 | 1 | 1 | 1 | 0 | 0 | R1 |
| V2 | V1 | 0 | 1 | 1 | 1 | 0 | 0 | 1 | R2 |
| V3 | V1 | 0 | 0 | 1 | 0 | 1 | 1 | 0 | R3 |
| V4 | V1 | 0 | 0 | 0 | 0 | 0 | 1 | 1 | R4 |

Figure 8:
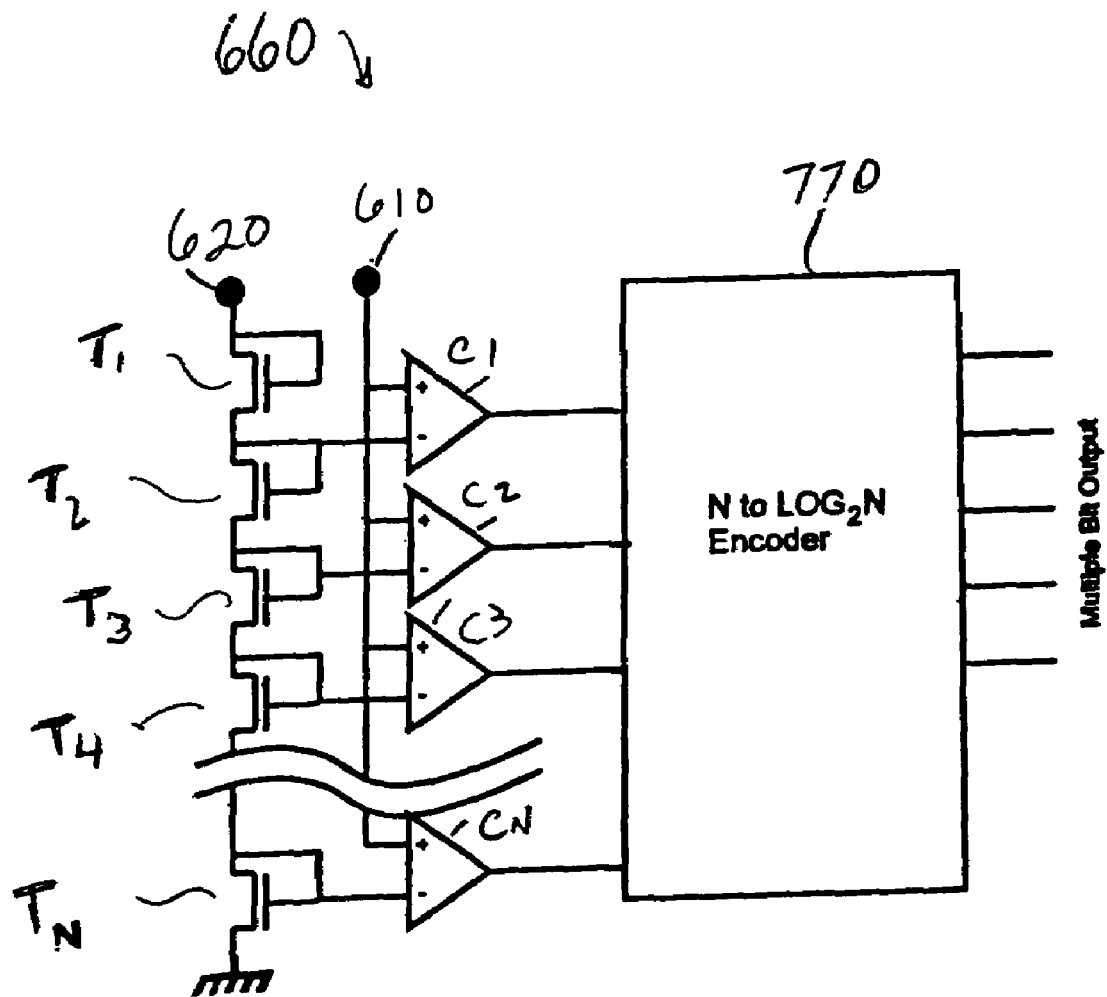
FIG. 8 is a diagram of an embodiment of a sense amplifier circuit.

Hence, the sense amplifier 660 may be used to determine the resistance state of the memory cells 120. The sense amplifier 660 is useful for determining the resistance states of memory cells programmed to four resistance states. A more general circuitry is shown in FIG. 8. The sense amplifier 660 shown in FIG. 8 includes an N to $LOG_2N$ encoder 770 and may be used for memory cells programmed to N states where N is at least three. Typically N will be four, eight or sixteen. Hence, for four states, the encoder will have $LOG_24=2$ outputs; for eight states, the encoder will have $LOG_28=3$ outputs, and for sixteen states the encoder will have $LOG_216=4$ outputs.

Figure 5:
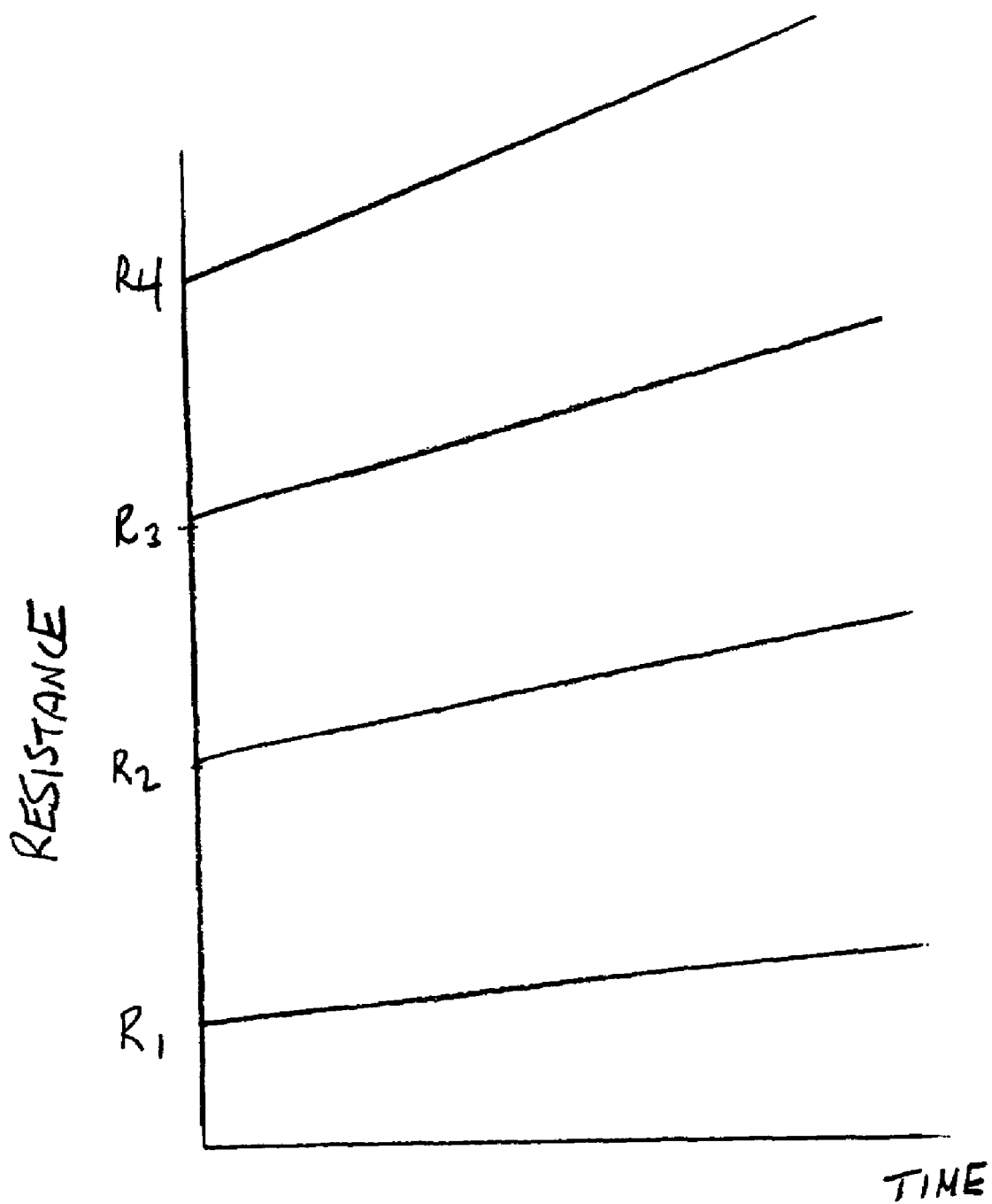
FIG. 5 is an example of drift of the resistance states of a chalcogenide-based phase-change memory element as a function of time.

After a phase-change memory element is programmed to a particular resistance state (for example, this may be the low resistance or SET state, high resistance or RESET state, or some intermediate state between the SET/RESET states such as R1, R2, R3, or R4 as shown in FIG. 1), the particular resistance value of the resistance state may drift higher over time. While not wishing to be bound by theory, it is believed that this drift may be due to mechanical stresses caused by the programming of the device as well as the release of these mechanical stresses. FIG. 5 provides an example of how the resistance values of resistance states R1, R2, R3 and R4 may increase with time. In the example shown in FIG. 5, the slope of the resistance over time is directly proportional to the initial resistance value of the resistance state (that is, the greater the initial value of the resistance, the more pronounced the drift). The drift in the resistance values may create a problem in distinguishing one resistance state from another, especially when the memory device is operated in a multistate mode.

As noted above, because the reference signals are developed from reference cells preferably having the same type of programmable resistance elements as the memory cells, the variations and drift in the resistance values of the memory cells will be "tracked" (and compensated for) by corresponding variations and drift in the reference cells.

In order to further compensate for drift, it is preferable that, when writing data to a memory array, all of the memory cells and all of the reference cells in a particular row of the memory array are written to (e.g. programmed to a particular resistance state) at substantially the same time. Hence, it is preferable that, when writing data to a memory array, all of the memory elements located in a particular row of the memory array should be written to at substantially the same time. This would include all of the memory elements that belong to memory cells as well as all of the memory elements that belong to reference cells. For example, referring to FIG. 6, when writing data to the memory array 1110, it is preferred that each memory cell 120 as well as each reference cell 130 belonging to a particular row R1 (where i may be 1, 2, 3 or 4) should be written to at substantially the same time. By writing to all of the memory cells and reference cells in a common row of the memory array at substantially the same time, all of the memory cells and all of the reference cells within that row will have drifted for about the same period of time prior to being read. Hence, the resistance state of the memory element is more accurately read.

More generally, given an array of programmable resistance elements it is preferable that all of the programmable resistance elements that are in a common row of the array are written to (e.g. programmed to a particular resistance state) at substantially the same time. It is possible that there is some small time difference between the time the first programmable resistance element is written to and the time the last programmable resistance element is written to. Preferably, this finite time difference is less than about 100 microseconds.

Figure 9:
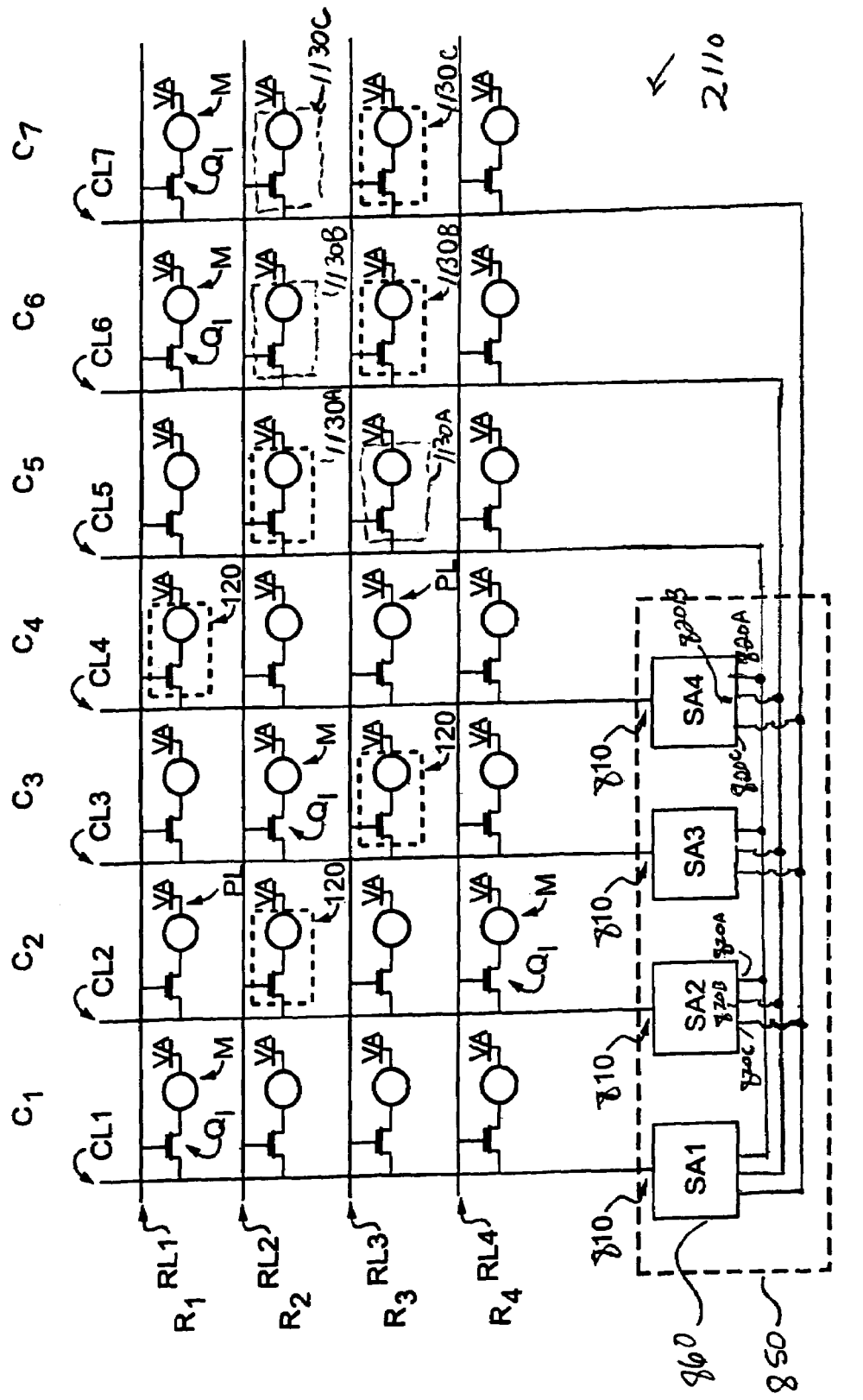
FIG. 9 is an embodiment of a memory array having memory cells and reference cells coupled to a comparison circuit.

The memory system shown in FIG. 6 uses a single column of reference cells. However, other embodiments are possible that use two or more columns of reference cells. Another example of a memory system that makes use of reference cells to determine the state of multistate memory cells is shown in FIG. 9. This example uses three columns of reference cells.

Figure 10:
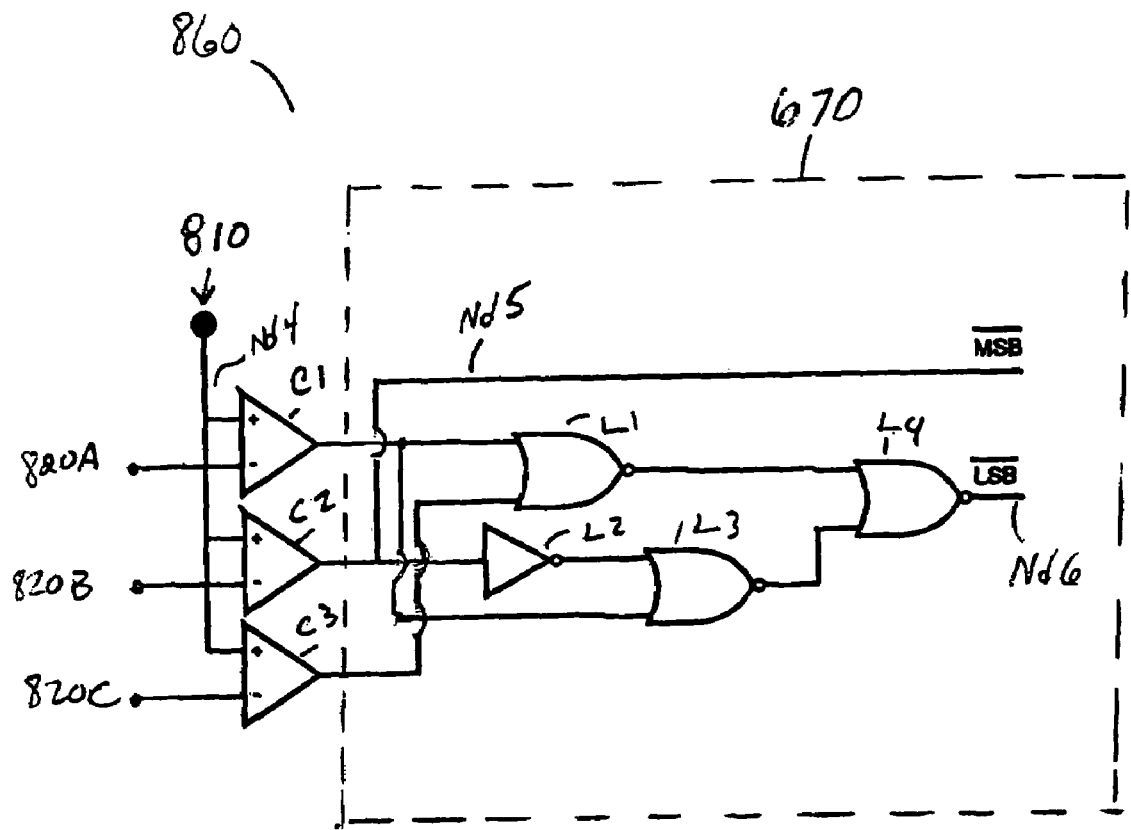
FIG. 10 is an embodiment of a sense amplifier circuit.
Figure 11:
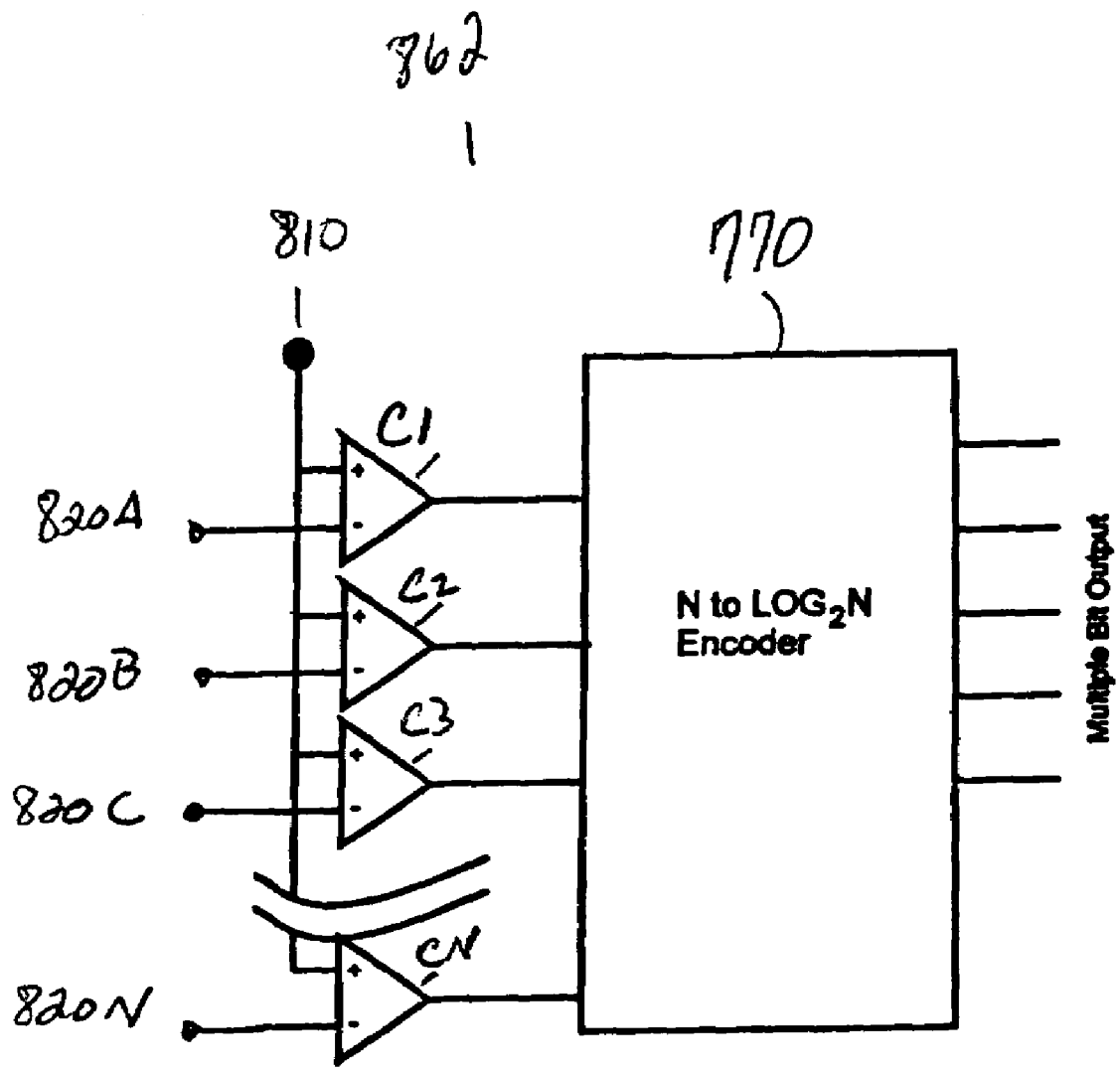
FIG. 11 is an embodiment of a sense amplifier circuit.

FIG. 9 shows a memory array 2110 having columns C1 . . . C7 and rows R1 . . . R4. Associated with the columns are column lines CL1 . . . CL7 and associated with the rows are row lines R1 . . . RL4. The memory cells 120 are arranged in the four columns C1 . . . C4 and in the four rows R1 . . . R4 of the array 2110. Reference cells 1130A are arranged in column C5 and in rows R1 . . . R4. Reference cells 1130B are arranged in columns C6 and rows R1 . . . R4. Reference cells 1130C are arranged in column C7 and rows R1 . . . R4. Each of the reference cells 1130A are preferably programmed to a first0 resistance state, each of the reference cells 1130B are preferably programmed to a second resistance state, and each of the reference cells 1130C are preferably programmed to a third resistance state. Each of the column lines CL1 . . . CL4 is coupled to a first input 810 of a corresponding sense amplifier 860 (SA1 . . . SA4) of the comparison circuit 850. The column line CL5, CL6 and CL7 are coupled to inputs 820A, 820B and 820C of each of the sense amplifiers 860. More generally, the array may simply consist of a single row of memory cells and reference cells. Preferably, the array consists of at least two rows. Likewise, the array may consist of only a single column of memory cells. Preferably, there are at least two columns of memory cells. The number of columns of reference cells is related to the number of states of each of the programmable resistance elements. In the example shown in FIG. 9 there are three columns of reference cells for four (4) resistance states (however, other examples are possible where there are N-1 columns of reference cells for N resistance states. N may be at least two. FIG. 10 provides an example of a sense amplifier 860 that uses sense signals from the reference cells 1130A, 1130B and 1130C to distinguish the difference states of the memory cells 120 shown in array 2110 of FIG. 9. Input 810 is coupled to a corresponding column line CL1 . . . CL4 of array 2110 to provide the sense signal from the corresponding memory cell 120 of a selected row while inputs 820A, B, C are coupled to the column lines CL5, CL6 and CL7, respectively, to provide the reference signals from the reference cells 1130A, 1130B and 1130C from the same selected row of the array 2110 of FIG. 9. The sense amplifier 860 includes the 4 to 2 encoder 670 that as shown in FIG. 10. The sense amplifier 860 is the same as shown in FIG. 7. FIG. 11 shows a sense amplifier 862 that includes an N to LOG$_2$N encoder 770 which may be used when the number of programmable states N is more than four (such as eight, sixteen, thirty two, etc).

Again, for purposes of illustration, it is assumed that the each of the memory cells 120 of the array 2110 is programmable to four resistance states R1, R2, R3 and R4 (with R4>R3>R2>R1). Each of the resistance states R1, R2, R3 and R4 results in a corresponding voltage V1, V2, V3 and V4 at the input 810 at each sense amplifier 860 (with V1>V2>V3>V4).

Each of the reference cells 1130A are preferably set to a resistance value which is between R1 and R2, so that the voltage at input 820A is between V1 and V2. Likewise, each of the reference cells 1130B is set to a resistance between R2 and R3 so that the voltage at input 820B is between V2 and V3. Additionally, each of the reference cells 1130C is set to a resistance between R3 and R4 so that the voltage at input 820C is between V3 and V4. The voltages at inputs 810 and 820A, B, C may thus be used by the comparators C1, C2 and C3 to determine whether the voltage at node 810 is V4, V3, V2, or V1 (thereby determining if the resistance state corresponds to R4, R3, R2 or R1, respectively). It is preferable that all of the memory cells 120 and all of the reference cells 1130A, 1130B and 1130C that are in a common row of the array are written to at substantially the same time. As noted, this type of scheme may be used for programmable resistance elements programmable between N states where is at least two. In such a scheme, N-1 columns of reference cells will be used.

As noted above, given an array of programmable resistance elements it is preferable that all of the programmable resistance elements that are in a common row of the array are written to (e.g. programmed to a particular resistance state) at substantially the same time. It is possible that there is some small time difference between the time the first programmable resistance element is written to and the time the last programmable resistance element is written to. Preferably, this finite time difference is less than about 100 microseconds.

It is noted that the method of writing to all of the memory cells and reference cells in a particular row of a memory array at substantially the same time is applicable to memory elements and arrays that are operating in binary mode (only two resistance states) as well as memory elements operating in multistate mode (three or more resistance states). The method of writing to all of the memory cells and reference cells in a particular row of a memory array at substantially the same time is not limited to any particular array configuration, and, of course, is applicable to all of the array configuration discussed herein.

Additionally, it is possible that a programmable resistance memory array consist of only memory cells and that fixed resistors are used to determine the resistance state of the memory cells rather than programmable reference cells. In this case, it may still be useful to write to all of the programmable resistance elements in a row of the array at the same time. In this case, each programmable resistance element will be part of a corresponding memory cell.

Additional, it is also possible that, in another embodiment of the invention, to provide a benefit by writing to at least two of the programmable resistance elements in a row of an array at substantially the same time. For example, it is possible to write to the reference cells that are in a particular row as well as to two or more of the memory cells that are in the same row at substantially the same time.

It is also conceivable that memory cells and reference cells used to determine the resistance state of the particular memory cells be organized in some fashion other than as an array. It is also possible that there be a benefit to write to these memory cells and reference cells at substantially the same time. Likewise, given a memory system comprising at least three programmable resistance elements, it is possible to provide benefit by preferably writing to two or more of these programmable resistance elements at substantially the same time. Once again, it is possible that there is some small time difference between the time the first programmable resistance element is written to and the time the last programmable resistance element is written to. Preferably, this finite time difference is less than about 100 microseconds.

It is noted that further examples of array configurations for memory cells and reference cells is provided in U.S. Pat. No. 6,608,773. U.S. Pat. No. 6,608,773 is hereby incorporated by reference herein.

Figure 13:
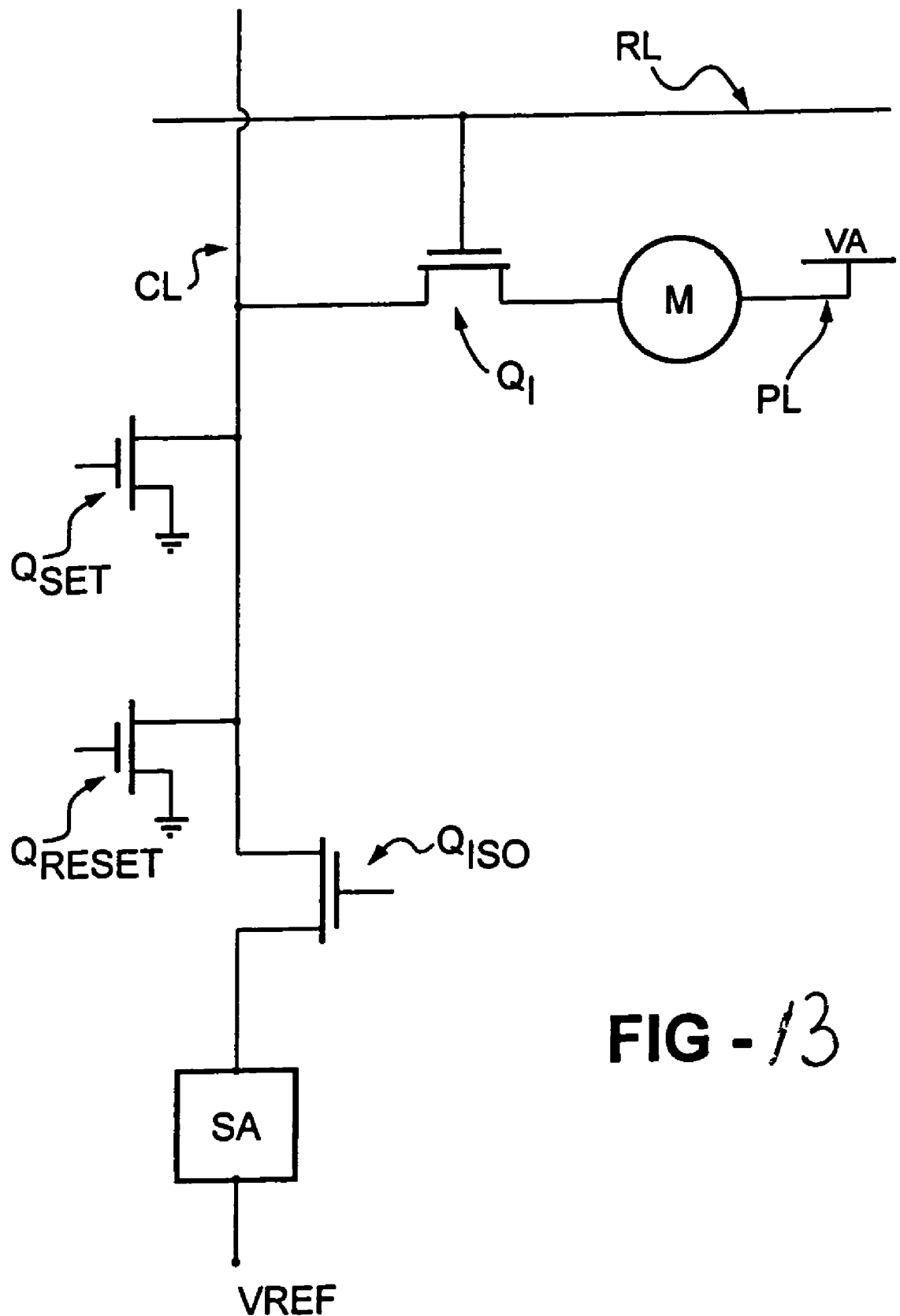
FIG. 13 is a diagram showing a memory or reference cell as well as current sinking transistors coupled to the column lines used for writing to the memory or reference cell.

As noted above, during a write operation the programmable resistant memory element may be programmed to one of a plurality of resistance values. The memory element is programmed by directing currents through the memory element. For example, currents may be directed through the memory element which are sufficient to either set or reset the memory element. FIG. 13 shows a memory cell (or reference cell) coupled to a column line CL and a row line RL. The memory or reference cell is similar to that shown in FIG. 4A. Included in FIG. 13 are current sink transistors $Q_{SET}$ and $Q_{RESET}$ that selectively couple the column line CL to ground. Also, shown is isolation transistor $Q_{Iso}$ which is used to selectively couple the column line CL to a sense amplifier SA. The isolation transistor is preferably turned off during the write operation so that the column line CL is isolated from the sense amplifier SA during the write operation. Reference voltage VREF is shown as another input to the sense amplifier SA. The circuitry shown in FIG. 13 would be appropriate for binary operation where the memory element is programmed between its SET state and its RESET state. For multistate operation QSET and QRESET may be replaced by other transistors than can sink the appropriate currents that will program the memory element to desired resistance states.

Regarding binary operation, to program the memory element M to its SET state, the row line RL is brought high (placing transistor $Q_I$ into the "on" state) and VA is also brought to a high level appropriately chosen for the write operation. The column line CL is then brought low by activating the current sink transistor $Q_{SET}$ causing a "set current" to flow through the column line CL as well as through the memory element M. The level of the set current may be user adjustable over a wide range preferably, between about 50 uA to about 300 uA. The duration of the set current may be between about 10 nanoseconds to about 200 nanoseconds. Parallel programming of up to 16 or 32 bits in parallel may be provided. The set operation is terminated by turning off the current sink transistor $Q_{SET}$, thereby bringing the column line CL high, preferably to the level Vcc (the power supply voltage).

To program the memory element M to its RESET state, the rowline RL is brought high and VA is also brought to a high level. In this case, the column line is brought low by activating the current sink transistor $Q_{RESET}$ causing a "reset" current to flow through the column line CL as well as through the memory element M. The level of the reset current should also be user adjustable over a wide range (preferably, between about 90 uA to about 500 uA).

The reset current preferably has a sharp falling edge at the end of the current pulse to ensure that the memory material is programmed to its high resistance state. The reset operation is terminated by turning off the reset current sink transistor $Q_{RESET}$ thereby bringing the column line CL high.

As described above, the programmable resistance element of the memory system of the present invention is programmable to at least a first resistance state and a second resistance state. The programmable resistance element may be directly overwritable so that it can be programmed to a specific resistance state (for example, the first or the second resistance state) without the need to first be programmed to any starting state. The programmable resistance element may be a programmable resistor.

The programmable resistance element preferably comprises a volume of memory material which is programmable to at least a first and a second resistance state. Preferably, the volume of memory material is a phase-change material. The phase-change material is preferably formed from a plurality of constituent atomic elements. For example, the phase-change material may include one or more elements selected from the group consisting of Te, Se, Ge, Sb, Bi, Pb, Sn, As, S, Si, P, O and mixtures or alloys thereof. Preferably, the phase-change material includes at least one chalcogen element. Preferably, the at least one chalcogen element is selected from the group consisting of Te, Se and mixtures or alloys thereof. The at least one chalcogen element may be a mixture of Te and Se.

An example of a phase-change memory material is a composition where the average concentration of Te is preferably less than about 70%, and more preferably between about 40% and about 60%. The concentration of Ge in the material is preferably greater than about 5%, more preferably between about 8% and about 50%, and most preferably between about 10% and about 44%. The remainder of the principal constituent elements is Sb. The percentages given are atomic percentages which preferably total 100% of the atoms of the constituent elements. Thus, this composition may be characterized as $Te_aGe_bSb_{100-(a+b)}$. These ternary Te—Ge—Sb alloys are useful starting materials for the development of additional phase-change materials having even better electrical characteristics.

The phase-change material may include at least one transition metal element. The term "transition metal" as used herein includes elements 21 to 30, 39 to 48, 57 and 72 to 80. Preferably, the transition metal element is selected from the group consisting of Cr, Fe, Ni, Nb, Pd, Pt and mixtures or alloys thereof. Most preferably the transition metal is Ni. Specific examples of such multi-element systems are set forth hereinafter with respect to the Te:Ge:Sb system with or without Ni and/or Se. The phase-change materials which include transition metals are elementally modified forms of the phase-change materials in the Te—Ge—Sb ternary system. That is, the elementally modified phase-change materials constitute modified forms of the Te—Ge—Sb phase-change alloys. This elemental modification is achieved by the incorporation of transition metals into the basic Te—Ge—Sb ternary system, with or without an additional chalcogen element, such as Se.

An example of an elementally modified phase-change material is a phase-change material which includes Te, Ge, Sb and a transition metal, in the ratio $(Te_aGe_bSb_{100-(a+b)})_c TM_{100-c}$ where the subscripts are in atomic percentages which total 100% of the constituent elements, wherein TM is one or more transition metals, a and b are as set forth herein above for the basic Te—Ge—Sb ternary system and c is preferably between about 90% and about 99.99%. The transition metal preferably include Cr, Fe, Ni, Nb, Pd, Pt and mixtures or alloys thereof.

Another example of an elementally modified phase-change material is a phase-change material which includes Te, Ge, Sb, Se and a transition metal, in the ratio $(Te_aGe_bSb_{100-(a+b)})_c TM_dSe_{100-(c+d)}$ where the subscripts are in atomic percentages which total 100% of the constituent elements, TM is one or more transition metals, a and b are as set forth hereinabove for the basic Te—Ge—Sb ternary system, c is preferably between about 90% and 99.5% and d is preferably between about 0.01% and 10%. The transition metal preferably includes Cr, Fe, Ni, Pd, Pt, Nb and mixtures or alloys thereof.

The memory element includes means for applying the energy to the volume of memory material. When the energy is electrical energy, the memory element may include electrical contacts for supplying the voltage or current to the volume of memory material. The shape of the contacts as well as their positioning relative to the volume of memory material may be varied to form different device structures. As an example, the electrical contacts may include first and second contacts positioned adjacent to the memory material. An example of a memory element design is provided in U.S. patent application Ser. No. 09/276,273, the disclosure of which is incorporated herein by reference.

A characteristic of electrical memory devices, is its resistance to dosages of radiation. This is referred to as the "radiation hardness" of the device. In particular, radiation penetrating semiconductor materials such as silicon and silicon oxides may be affected by doses of radiation. For example, the radiation generates mobile electrons and holes in the silicon oxide. The holes are quickly trapped and immobilized near the interface of the silicon oxide and silicon where their charges change the electrical characteristics of the device.

Various techniques have been developed for forming or treating the silicon oxide so as to improve the radiation hardness of the device. Preferably, the memory system of the present invention are preferably adapted to be "radiation hard", that is, resistant to radiation.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

I claim:

1. A method of operating a memory system, said memory system including a first programmable resistance element and a second programmable resistance element, said method comprising the steps of:
   providing said first programmable resistance element, said first programmable resistance element being programmable among a first plurality of resistance states, each of said first plurality of resistance states having a resistance that varies spontaneously over time;
   providing said second programmable resistance element, said second programmable resistance element being programmable among a second plurality of resistance states, each of said second plurality of resistance states having a resistance that varies spontaneously over time;
   programming said first programmable resistance element to one of said first plurality of resistance states;
   programming said second programmable resistance element to one of said second plurality of resistance states, said programming of said second programmable resistance element occurring within 100 microseconds of said programming of said first programmable resistance element.

2. The method of claim 1, wherein said first programmable resistance element comprises a phase change material, said phase change material having a plurality of structural states, said structural states differing in resistance, said first plurality of resistance states being selected from among said structural states.

3. The method of claim 1, wherein said first programmable resistance element comprises a chalcogenide material.

4. The method of claim 1, wherein said programming of said second programmable resistance element occurs simultaneously with said programming of said first programmable resistance element.

5. The method of claim 1, further comprising the steps of:
   providing a first electrical signal to said first programmable resistance element, said first programmable resistance element converting said first electrical signal to a first output signal;
   providing a second electrical signal to said second programmable resistance element, said second programmable resistance element converting said second electrical signal to a second output signal; and
   comparing said first output signal to said second output signal.

6. The method of claim 5, wherein said first electrical signal does not alter the resistance of said first programmable resistance element.

7. The method of claim 6, wherein said second electrical signal does not alter the resistance of said second programmable resistance element.

8. The method of claim 5, wherein said second electrical signal is provided within 100 microseconds of said first electrical signal.

9. The method of claim 5, wherein said first electrical signal alters the crystallinity of said first programmable resistance element.

10. A method of operating a memory system, said memory system including a first programmable resistance element, a second programmable resistance element, and a third programmable resistance element; said method comprising the steps of:
    providing said first programmable resistance element, said first programmable resistance element being programmable among a first plurality of resistance states;
    providing said second programmable resistance element, said second programmable resistance element being programmable among a second plurality of resistance states;
    providing said third programmable resistance element, said third programmable resistance element being programmable among a third plurality of resistance states;
    programming said first programmable resistance element to one of said first plurality of resistance states;
    programming said second programmable resistance element to one of said second plurality of resistance states;
    programming said third programmable resistance element to one of said third plurality of resistance states;
    providing a first electrical signal to said first programmable resistance element, said first programmable resistance element converting said first electrical signal to a first output signal;
    providing a second electrical signal to said second programmable resistance element, said second programmable resistance element converting said second electrical signal to a first intermediate signal;
    providing a third electrical signal to said third programmable resistance element, said third programmable resistance element converting said third electrical signal to a second intermediate signal;
    combining said first intermediate signal and said second intermediate signal, said combination forming a second output signal; and
    comparing said first output signal to said second output signal.

11. The method of claim 2, wherein said second programmable resistance element comprises a phase change material, said phase change material having a plurality of structural states, said structural states differing in resistance, said second plurality of resistance states being selected from among said structural states.

12. The method of claim 11, wherein said second programmable resistance element is programmed to the set state of said phase-change material.

13. The method of claim 11, wherein said second programmable resistance element is programmed to the reset state of said phase-change material.

14. The method of claim 5 further comprising:
    providing a third programmable resistance element said third programmable resistance element being programmable among a third plurality of resistance states, each of said third plurality of resistance states having a resistance that varies spontaneously over time;
    programming said third programmable resistance element to one of said third plurality of resistance states;
    providing a third electrical signal to said third programmable resistance element, said third programmable resistance element converting said third electrical signal to a third output signal; and
    comparing said first output signal to said third output signal.

15. The method of claim 5, wherein said comparison is performed with a comparison circuit, said comparison circuit receiving said first output signal as a first input and said second output signal as a second input, said comparison circuit producing a third output signal.

16. The method of claim 15, wherein said third output signal corresponds to the resistance state of said first programmable resistance element.

17. The method of claim 16, wherein said third output signal compensates for drift in said resistance state of said first programmable resistance element.

18. The method of claim 17, wherein said drift is corresponds to the variation in the resistance of said first programmable resistance element between the time of said programming of said first programmable resistance element and the time of said providing said first electrical signal to said first programmable resistance element.

19. The method of claim 1, wherein said first plurality of resistance states includes at least three resistance states.

* * * * *